(12) United States Patent
Zhao et al.

(10) Patent No.: US 12,256,572 B1
(45) Date of Patent: Mar. 18, 2025

(54) TRANSISTORS, METHOD FOR MAKING THE SAME, ELECTROSTATIC DISCHARGE PROTECTION CIRCUIT, AND ELECTRONIC DEVICE

(71) Applicant: Halo Microelectronics Co., Ltd, Foshan (CN)

(72) Inventors: Lijie Zhao, Foshan (CN); Suming Lai, San Diego, CA (US)

(73) Assignee: Halo Microelectronics Co., Ltd, Foshan (CN)

( * ) Notice: Subject to any disclaimer, the term of this patent is extended or adjusted under 35 U.S.C. 154(b) by 0 days.

(21) Appl. No.: 18/898,465

(22) Filed: Sep. 26, 2024

(30) Foreign Application Priority Data

Jun. 14, 2024 (CN) .......................... 202410764266.7

(51) Int. Cl.
  *H10D 89/00* (2025.01)
  *H10D 10/00* (2025.01)
  *H10D 89/60* (2025.01)

(52) U.S. Cl.
  CPC ............ *H10D 89/711* (2025.01); *H10D 10/00* (2025.01)

(58) Field of Classification Search
  None
  See application file for complete search history.

(56) References Cited

U.S. PATENT DOCUMENTS

| 5,525,829 | A | 6/1996 | Mistry | |
|---|---|---|---|---|
| 5,652,689 | A * | 7/1997 | Yuan | H10D 89/713 361/111 |
| 2002/0053704 | A1 * | 5/2002 | Avery | H01L 27/0255 257/361 |
| 2004/0201033 | A1 * | 10/2004 | Russ | H10D 8/80 257/107 |
| 2005/0151160 | A1 * | 7/2005 | Salcedo | H10D 89/713 257/362 |
| 2009/0294799 | A1 * | 12/2009 | Terashima | H10D 84/409 257/358 |
| 2016/0036217 | A1 * | 2/2016 | Su | H10D 89/813 361/56 |

FOREIGN PATENT DOCUMENTS

| CN | 108346653 A | 7/2018 |
|---|---|---|
| EP | 3981028 A1 | 4/2022 |
| KR | 1020210111983 A | 9/2021 |

* cited by examiner

*Primary Examiner* — Bilkis Jahan
(74) *Attorney, Agent, or Firm* — AP3 Law Firm PLLC

(57) ABSTRACT

The present disclosure provides a transistor, a method for configuring the same, an electrostatic discharge (ESD) protection circuit, and an electronic device for ESD protection. The transistor comprises a P-type well, a body terminal region, a source region, and a metal silicide layer. The body terminal region and the source region are disposed within the P-type well. The body terminal region is adjacent to the source region. The metal silicide layer is disposed on surfaces of the body terminal region and the source region, and electrically connected to the body terminal region and the source region separately. A metal and contact structures are provided on the metal silicide layer to adjust the resistance between the emitter of the parasitic bipolar transistor of the transistor and the body terminal region or between the base of the parasitic bipolar transistor and the source region, for ESD protection.

20 Claims, 19 Drawing Sheets a1 a2 c1 c2

| Arranging, in a P-type well of the transistor, a source region and a body terminal region adjacent to the source region. | ─1801 |

↓

| Arranging a first metal silicide layer on surfaces of the body terminal region and the source region, where the first metal silicide layer is electrically connected to the body terminal region and the source region separately. | ─1802 |

↓

| Arranging a plurality of first contact structures only on a portion of the first metal silicide layer that is on the surface of the body terminal region, each of the first contact structures being electrically connected to the body terminal region through the first metal silicide layer to increase the resistance between the emitter of a parasitic bipolar transistor and the body terminal region; or, arranging a plurality of first contact structures only on a portion of the first metal silicide layer that is on the surface of the source region, each of the first contact structures being electrically connected to the source region through the first metal silicide layer to increase the resistance between the base of the parasitic bipolar transistor and the source region; where each of the first contact structures is electrically connected to a first metal. | ─1803 |

FIG. 18

Arranging, in a P-type well of the transistor, a source region and a body terminal region adjacent to the source region, where the source region includes a first source sub-region and a second source sub-region, and the body terminal region is arranged between the first source sub-region and the second source sub-region. — 1901

Arranging a first metal silicide layer on surfaces of the body terminal region, the first source sub-region and the second source sub-region, where the first metal silicide layer is electrically connected to the body terminal region, the first source sub-region and the second source sub-region separately. — 1902

Arranging a plurality of first contact structures only on a portion of the first metal silicide layer that is on the surface of the body terminal region, each of the first contact structures being electrically connected to the body terminal region through the first metal silicide layer, to increase the resistance between the emitter of a first parasitic bipolar transistor and the body terminal region and the resistance between the emitter of a second parasitic bipolar transistor and the body terminal region;
or,
arranging a plurality of first contact structures only on portions of the first metal silicide layer that is on the surfaces of the first source sub-region and the second source sub-region, each of the first contact structures being electrically connected to the first source sub-region and the second source sub-region through the first metal silicide layer, to increase the resistance between the base of the first parasitic bipolar transistor and the first source sub-region and the resistance between the base of the second parasitic bipolar transistor and the second source sub-region;
where each of the first contact structures is electrically connected to the first metal. — 1903

FIG. 19

TRANSISTORS, METHOD FOR MAKING THE SAME, ELECTROSTATIC DISCHARGE PROTECTION CIRCUIT, AND ELECTRONIC DEVICE

CROSS-REFERENCE TO RELATED APPLICATIONS

This application claims priority to Chinese Patent Application No. 202410764266.7, filed on Jun. 14, 2024, and entitled "Transistor, Method for Making the Same, Electrostatic Discharge Protection Circuit, and Electronic Device," which is hereby incorporated by reference in its entirety.

TECHNICAL FIELD

The present disclosure relates generally to the field of electrostatic discharge (ESD) protection technology, and particularly, to a transistor, a method for making the same, an ESD protection circuits, and an electronic device.

BACKGROUND

Electrostatic discharge (ESD) protection refers to protecting a circuit from damage caused by ESD. ESD occurs when two different objects come into contact or separate, generating a sudden discharge of static electricity. This can cause damage to a circuit to be protected. To prevent such damage, a series of measures can be taken, such as using an ESD protection circuit, to ensure the safe operation of the circuit to be protected.

SUMMARY

Embodiments of the present disclosure provide a transistor, a method for making the same, an ESD protection circuit, and an electronic device capable of achieving more reliable ESD protection.

In a first aspect, the disclosure provides a transistor, comprising: a P-type well, a body terminal region, and a source region, where the body terminal region and the source region are disposed within the P-type well, and the body terminal region is adjacent to the source region; a first metal silicide layer disposed on the surfaces of the body terminal region and the source region and separately electrically connected to the body terminal region and the source region; and a first metal and multiple first contact structures, where the first metal is electrically connected only to a portion of the first metal silicide layer on the surface of the body terminal region through the multiple first contact structures, thereby increasing the resistance between the emitter of a parasitic bipolar transistor and the body terminal region; or, the first metal is electrically connected only to the portion of the first metal silicide layer on the surface of the source region through the multiple first contact structures, thereby increasing the resistance between the base of the parasitic bipolar transistor and the source region. The PN junction between the base and emitter of the parasitic bipolar transistor is formed between the P-type well and the source region.

In a second aspect, the disclosure provides a transistor, comprising: a P-type well, a body terminal region, and a source region, where the body terminal region and the source region are both disposed within the P-type well, and the body terminal region is adjacent to the source region, where the source region includes a first source sub-region and a second source sub-region, with the body terminal region disposed between the first source sub-region and the second source sub-region; a first metal silicide layer disposed on the surfaces of the body terminal region, the first source sub-region and the second source sub-region, and separately electrically connected to the body terminal region, the first source sub-region, and the second source sub-region; and a first metal and multiple first contact structures, where the first metal is electrically connected only to a portion of the first metal silicide layer on the surface of the body terminal region through the multiple first contact structures, thereby increasing the resistance between the emitter of a first parasitic bipolar transistor and the body terminal region and between the emitter of a second parasitic bipolar transistor and the body terminal region; or, the first metal is electrically connected to portions of the first metal silicide layer on the surfaces of the first source sub-region and the second source sub-region through the multiple first contact structures, thereby increasing the resistance between the base of the first parasitic bipolar transistor and the first source sub-region and between the base of the second parasitic bipolar transistor and the second source sub-region. The PN junction between the base and emitter of the first parasitic bipolar transistor is formed between the P-type well and the first source sub-region, and the PN junction between the base and emitter of the second parasitic bipolar transistor is formed between the P-type well and the second source sub-region.

In one or more embodiments, the body terminal region and the source region are arranged continuously and side by side.

In one or more embodiments, the body terminal region is discontinuous and embedded in the source region, and surrounded by the source region.

In one or more embodiments, the shape of the first metal silicide layer is adjusted to regulate the resistance between the source region and the body terminal region.

In a third aspect, the disclosure provides an ESD protection circuit electrically connected to a signal input terminal, comprising the transistor as described above; the first metal in the transistor is shorted to the gate of the transistor and electrically connected to ground, and a drain region of the transistor is electrically connected to the signal input terminal.

In one or more embodiments, the transistor further comprises an N-type drift region, a drain region disposed in the N-type drift region, a second metal silicide layer, a second metal, and multiple second contact structures, where the drain region is electrically connected to the second metal through the second metal silicide layer and the multiple second contact structures. The second metal is electrically connected to the signal input terminal.

In a fourth aspect, the disclosure provides an ESD protection circuit electrically connected to a signal input terminal, comprising the transistor as described above; The first metal in the transistor is also shorted to two gates of the transistor, a first drain of the transistor is electrically connected to the signal input terminal, and a second drain of the transistor is grounded.

In one or more embodiments, the transistor further comprises a first N-type drift region, a second N-type drift region, a first drain region disposed in the first N-type drift region, a second drain region disposed in the second N-type drift region, a second metal silicide layer, a third metal silicide layer, a second metal, a third metal, multiple second contact structures, and multiple third contact structures;

The first drain region is electrically connected to the second metal through the second metal silicide layer and the multiple second contact structures, with the second metal being electrically connected to the signal input terminal.

The second drain region is electrically connected to the third metal through the third metal silicide layer and the multiple third contact structures, with the third metal being grounded.

In a fifth aspect, the disclosure provides a method for configuring a transistor, comprising: configuring a source region and an adjacent body terminal region within a P-type well of the transistor; disposing a first metal silicide layer on the surfaces of the body terminal region and the source region, with the first metal silicide layer separately electrically connected to the body terminal region and the source region; configuring multiple first contact structures only on a portion of the first metal silicide layer on the surface of the body terminal region, with each first contact structure electrically connected to the body terminal region through the first metal silicide layer, thereby increasing the resistance between the emitter of a parasitic bipolar transistor and the body terminal region; or, configuring multiple first contact structures only on a portion of the first metal silicide layer on the surface of the source region, with each first contact structure electrically connected to the source region through the first metal silicide layer, thereby increasing the resistance between the base of the parasitic bipolar transistor and the source region, with each first contact structure electrically connected to the first metal.

In a sixth aspect, the disclosure provides a method for configuring a transistor, comprising: configuring a source region and an adjacent body terminal region within a P-type well of the transistor, where the source region includes a first source sub-region and a second source sub-region, with the body terminal region disposed between the first source sub-region and the second source sub-region; disposing a first metal silicide layer on the surfaces of the body terminal region, the first source sub-region, and the second source sub-region, with the first metal silicide layer separately electrically connected to the body terminal region, the first source sub-region, and the second source sub-region; configuring multiple first contact structures only on a portion of the first metal silicide layer on the surface of the body terminal region, with each first contact structure electrically connected to the body terminal region through the first metal silicide layer, thereby increasing the resistance between the emitter of a first parasitic bipolar transistor and the body terminal region and between the emitter of a second parasitic bipolar transistor and the body terminal region; or, configuring multiple first contact structures only on portions of the first metal silicide layer on the surfaces of the first source sub-region and the second source sub-region, with each first contact structure electrically connected to the first source sub-region and the second source sub-region through the first metal silicide layer, thereby increasing the resistance between the base of the first parasitic bipolar transistor and the first source sub-region and between the base of the second parasitic bipolar transistor and the second source sub-region, with each first contact structure electrically connected to the first metal.

In one or more embodiments, configuring the source region and the adjacent body terminal region within the P-type well of the transistor includes: configuring a continuous source region and an adjacent body terminal region arranged in parallel within the P-type well.

In one or more embodiments, configuring the source region and the adjacent body terminal region within the P-type well of the transistor includes: configuring a source region on the P-type well of the transistor and embedding a discontinuous body terminal region into the source region, with the body terminal region surrounded by the source region.

In one or more embodiments, the method for configuring the transistor further includes: adjusting the shape of the first metal silicide layer to regulate the resistance between the source region and the body terminal region.

In a seventh aspect, the disclosure provides an electronic device, comprising a signal input terminal, a protected circuit, and the ESD protection circuit as described above, where the ESD protection circuit is electrically connected to the signal input terminal and the protected circuit.

According to one aspect of the present disclosure, a transistor is provided that includes: a P-type well, a body terminal region, and a source region, wherein the body terminal region and the source region are arranged in the P-type well, and the body terminal region is adjacent to the source region; a first metal silicide layer arranged on surfaces of the body terminal region and the source region, and electrically connected to the body terminal region and the source region separately; and a first metal and a plurality of first contact structures, wherein: the first metal is electrically connected, through the plurality of first contact structures, only to a first portion of the first metal silicide layer that is located on a surface of the body terminal region to generate a resistance between an emitter of a parasitic bipolar transistor of the transistor and the body terminal region, or the first metal is electrically connected, through the plurality of first contact structures, only to a second portion of the first metal silicide layer located on a surface of the source region to generate a resistance between a base of the parasitic bipolar transistor of the transistor and the source region; and wherein a PN junction between the base and the emitter of the parasitic bipolar transistor is located between the P-type well and the source region.

According to another aspect of the present disclosure, an electrostatic discharge protection circuit including a transistor is provided. The transistor includes: a P-type well, a body terminal region, and a source region, wherein the body terminal region and the source region are arranged in the P-type well, and the body terminal region is adjacent to the source region; a first metal silicide layer arranged on surfaces of the body terminal region and the source region, and electrically connected to the body terminal region and the source region separately; and a first metal and a plurality of first contact structures, wherein: the first metal is electrically connected, through the plurality of first contact structures, only to a first portion of the first metal silicide layer that is located on a surface of the body terminal region to generate a resistance between an emitter of a parasitic bipolar transistor of the transistor and the body terminal region, or the first metal is electrically connected, through the plurality of first contact structures, only to a second portion of the first metal silicide layer located on a surface of the source region to generate a resistance between a base of the parasitic bipolar transistor of the transistor and the source region. A PN junction between the base and the emitter of the parasitic bipolar transistor is located between the P-type well and the source region. The first metal of the transistor is connected to the gate of the transistor and electrically connected to a ground, and a drain of the transistor is electrically connected to a signal input terminal.

According to another aspect of the present disclosure, a method is provided that includes: arranging, in a P-type well of a transistor, a source region and a body terminal region adjacent to the source region; arranging a first metal silicide layer on surfaces of the body terminal region and the source region, wherein the first metal silicide layer is electrically connected to the body terminal region and the source region separately; and arranging a plurality of first contact structures only on a first portion of the first metal silicide layer that is arranged on a surface of the body terminal region, with each first contact structure electrically connected to the body terminal region through the first metal silicide layer to generate a resistance between an emitter of a parasitic bipolar transistor of the transistor and the body terminal region; or arranging a plurality of first contact structures only on a second portion of the first metal silicide layer that is arranged on a surface of the source region, with each first contact structure electrically connected to the source region through the first metal silicide layer to generate a resistance between a base of the parasitic bipolar transistor and the source region, wherein each first contact structure is electrically connected to the first metal; and wherein a PN junction between the base and the emitter of the parasitic bipolar transistor is located between the P-type well and the source region.

According to another aspect of the present disclosure, an electronic device is provided that includes: a signal input terminal, a circuit, and an electrostatic discharge protection circuit electrically connected to the signal input terminal and the circuit, wherein the electrostatic discharge protection circuit is configured to protect the circuit and includes a transistor. The transistor includes: a P-type well, a body terminal region, and a source region, wherein the body terminal region and the source region are arranged in the P-type well, and the body terminal region is adjacent to the source region; a first metal silicide layer arranged on surfaces of the body terminal region and the source region, and electrically connected to the body terminal region and the source region separately; and a first metal and a plurality of first contact structures, wherein: the first metal is electrically connected, through the plurality of first contact structures, only to a first portion of the first metal silicide layer that is located on a surface of the body terminal region to generate a resistance between an emitter of a parasitic bipolar transistor of the transistor and the body terminal region, or the first metal is electrically connected, through the plurality of first contact structures, only to a second portion of the first metal silicide layer located on a surface of the source region to generate a resistance between a base of the parasitic bipolar transistor of the transistor and the source region; and wherein a PN junction between the base and the emitter of the parasitic bipolar transistor is located between the P-type well and the source region; and wherein the first metal of the transistor is connected to a gate of the transistor and electrically connected to a ground, and a drain of the transistor is electrically connected to a signal input terminal.

Compared to the prior art, the transistor in aspect of this disclosure includes a P-type well, a body terminal region, a source region, a first metal silicide layer, a first metal, and multiple first contact structures. The body terminal region and the source region are disposed within the P-type well, with the body terminal region adjacent to the source region. The first metal silicide layer is disposed on the surfaces of the body terminal region and the source region and is separately electrically connected to the body terminal region and the source region. The first metal is electrically connected only to a portion of the first metal silicide layer on the surface of the body terminal region through multiple first contact structures, thereby increasing the resistance between the emitter of the parasitic bipolar transistor and the body terminal region; or, the first metal is electrically connected only to a portion of the first metal silicide layer on the surface of the source region through multiple first contact structures, thereby increasing the resistance between the base of the parasitic bipolar transistor and the source region. Multiple parasitic bipolar transistors are present in the transistor, and the parasitic bipolar transistors correspond to the first contact structures one-to-one. Consequently, when achieving ESD protection, if the resistance between the emitter of the parasitic bipolar transistor and the body terminal region is increased, each parasitic bipolar transistor can enter snapback more evenly, thereby achieving more reliable ESD protection. If the resistance between the base of the parasitic bipolar transistors and the source region is increased, each parasitic bipolar transistor can more easily enter snapback, similarly, achieving more reliable ESD protection.

BRIEF DESCRIPTION OF THE DRAWINGS

One or more embodiments are exemplarily illustrated with corresponding images in the accompanying drawings. These illustrative explanations do not limit the embodiments, and elements with the same reference numerals in the drawings represent similar elements unless otherwise specified. The drawings are not to scale unless specifically stated.

FIG. 18 is a flowchart of a method for configuring a transistor according to an embodiment of the present application; and FIG. 19 is a flowchart illustrating a method for configuring a transistor according to another embodiment of the present application.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

To make the objectives, technical solutions, and advantages of embodiments of the present application clearer, the embodiments will be described in detail with reference to the accompanying drawings. Obviously, the described embodiments are only part of the embodiments of the present application, not all embodiments. Based on the embodiments in the present application, all other embodiments obtained by those skilled in the art without creative work are within the scope of protection of the present application.

When an element is referred to as being "connected to" another element, it can be directly connected to another element or intervening elements may be present. In the context of the present application, the use of the terms "a," "an," "the," and similar terms should not be construed as limiting the quantity unless specifically stated otherwise.

The technical features involved in various embodiments of the present application can be combined with each other as long as they do not conflict.

Figure 1:
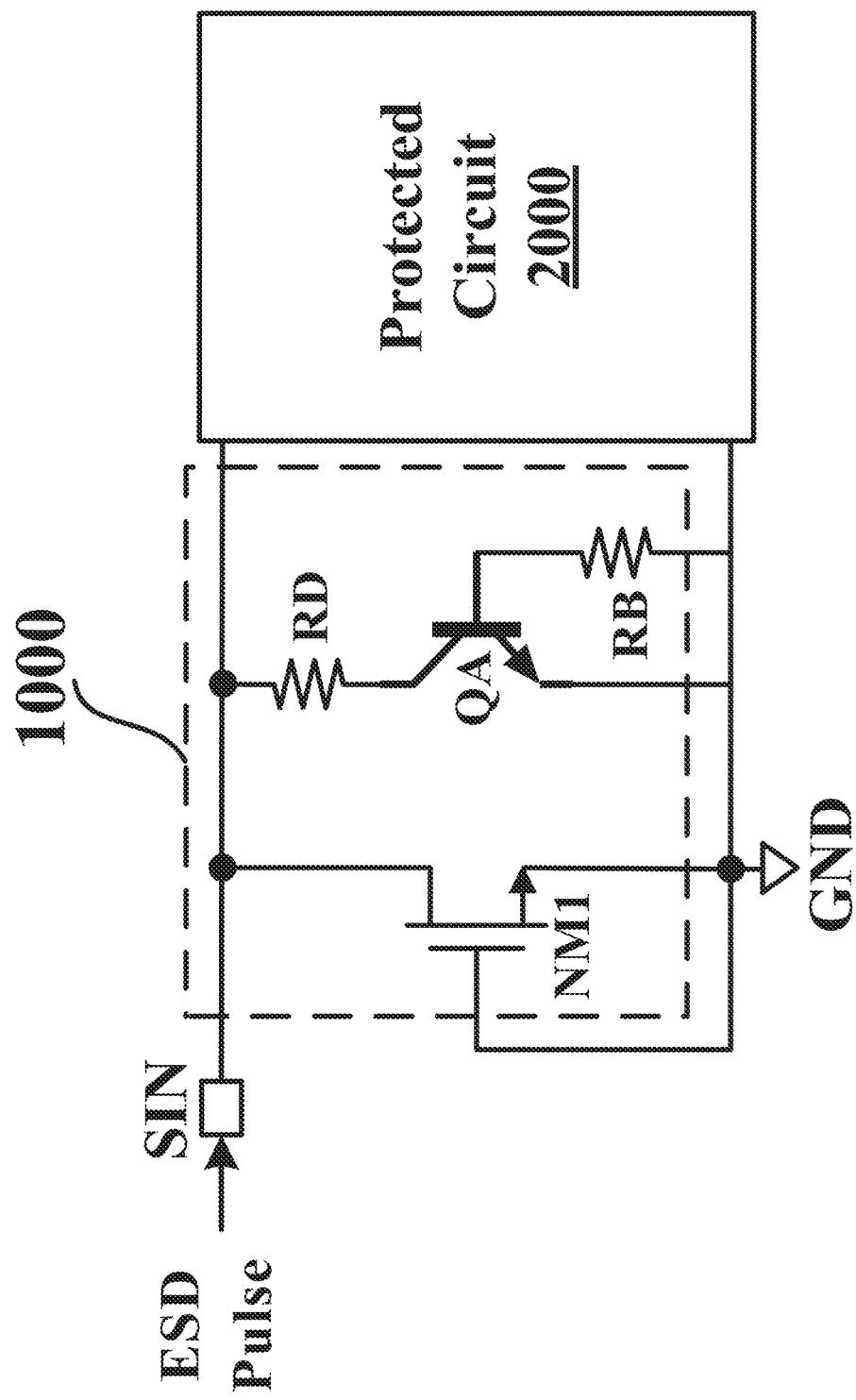
FIG. 1 is a schematic diagram of a transistor according to an embodiment of the present application.

Please refer to FIG. 1, which is a schematic diagram of an ESD protection circuit 1000 provided by the embodiments of the present application. As shown in FIG. 1, the ESD protection circuit 1000 is electrically connected between a signal input terminal SIN and a protected circuit 2000. As used herein, a protected circuit refers to a circuit to be protected or in protection by use of a protection circuit, e.g., an ESD protection circuit. The signal input terminal SIN is an I/O port and may be subjected to an ESD pulse. For example, an ESD pulse may be applied to the I/O port during a testing, e.g., through air discharge or contact discharge. In some embodiments of the present application, a transistor NM1 may be configured and connected between the signal input terminal SIN and the ground GND.

Specifically, the ESD protection circuit 1000 comprises a transistor NM1. The gate and source of the transistor NM1 are short-circuited and connected to the ground GND. The drain of the transistor NM1 is connected to the signal input terminal SIN. A parasitic bipolar transistor QA exists within the transistor NM1. The resistance between the collector of the parasitic bipolar transistor QA and the drain of the transistor NM1 is represented as an equivalent resistor RD, and the resistance between the base of the parasitic bipolar transistor QA and the source of the transistor NM1 is represented as an equivalent resistor RB.

Figure 2:
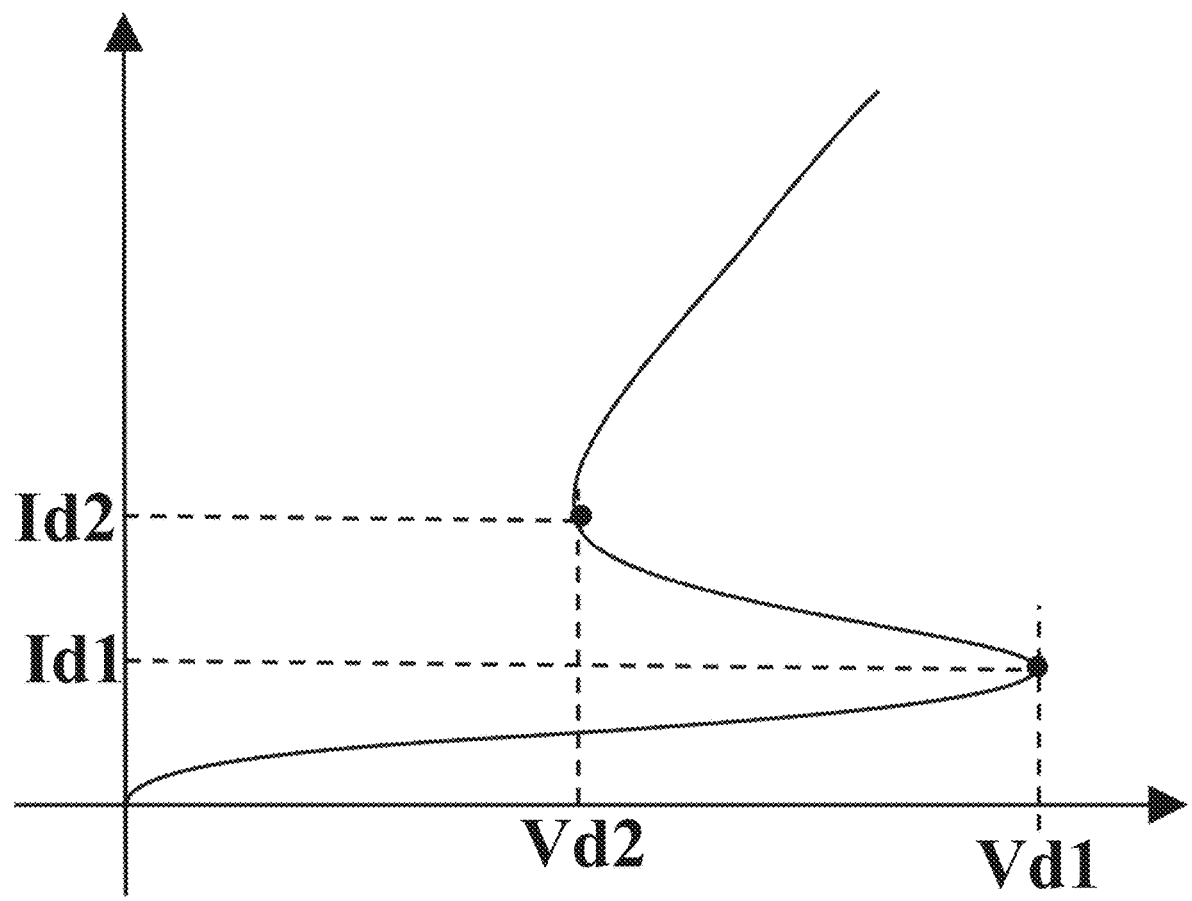
FIG. 2 is a diagram of a snapback curve of the transistor according to an embodiment of the present application.

Referring to FIG. 2, FIG. 2 shows an example snapback curve of the transistor NM1. In FIG. 2, the horizontal axis represents the voltage between the drain and source of the transistor NM1 (i.e., the drain-source voltage), and the vertical axis represents the current between the drain and source of the transistor NM1 (i.e., the drain-source current).

In some embodiment, taking the transistor NM1 being an N-type MOSFET transistor as an example, the source of the transistor NM1 may be located in a P-type well. When an ESD pulse is applied to the signal input terminal SIN (i.e., the drain of the transistor NM1), as the drain voltage increases, the PN junction between the P-type well and the drain of the transistor NM1 becomes reverse-biased. The electric field intensity in the depletion layer of the transistor NM1 increases, causing many electron-hole pairs to be generated due to impact ionization. Electrons flow to the drain, forming a drain current, while holes are injected into the P-type well, forming a current and generating a voltage drop across resistor RB, which raises the potential of the base of the parasitic bipolar transistor QA. This continues until when the PN junction between the P-type well and the source of the transistor NM1 becomes forward-biased, electrons flow into the P-type well from the source. When the voltage between the base and emitter of the parasitic bipolar transistor QA reaches the turn-on voltage (e.g., 0.5V), the parasitic bipolar transistor QA turns on. As more electrons flow to the drain of the transistor NM1, more electron-hole pairs are generated, causing the drain voltage to drop, leading to breakdown. As shown in FIG. 2, when the drain-source voltage of the transistor NM1 reaches voltage Vd1, the parasitic bipolar transistor QA turns on, breakdown occurs, and the drain-source voltage of the transistor NM1 quickly drops to voltage Vd2 and is maintained, forming a clamp. Subsequently, the drain-source voltage of the transistor NM1 linearly increases with the increase in drain-source current. This process achieves snapback and thus provides ESD protection.

Figure 3:
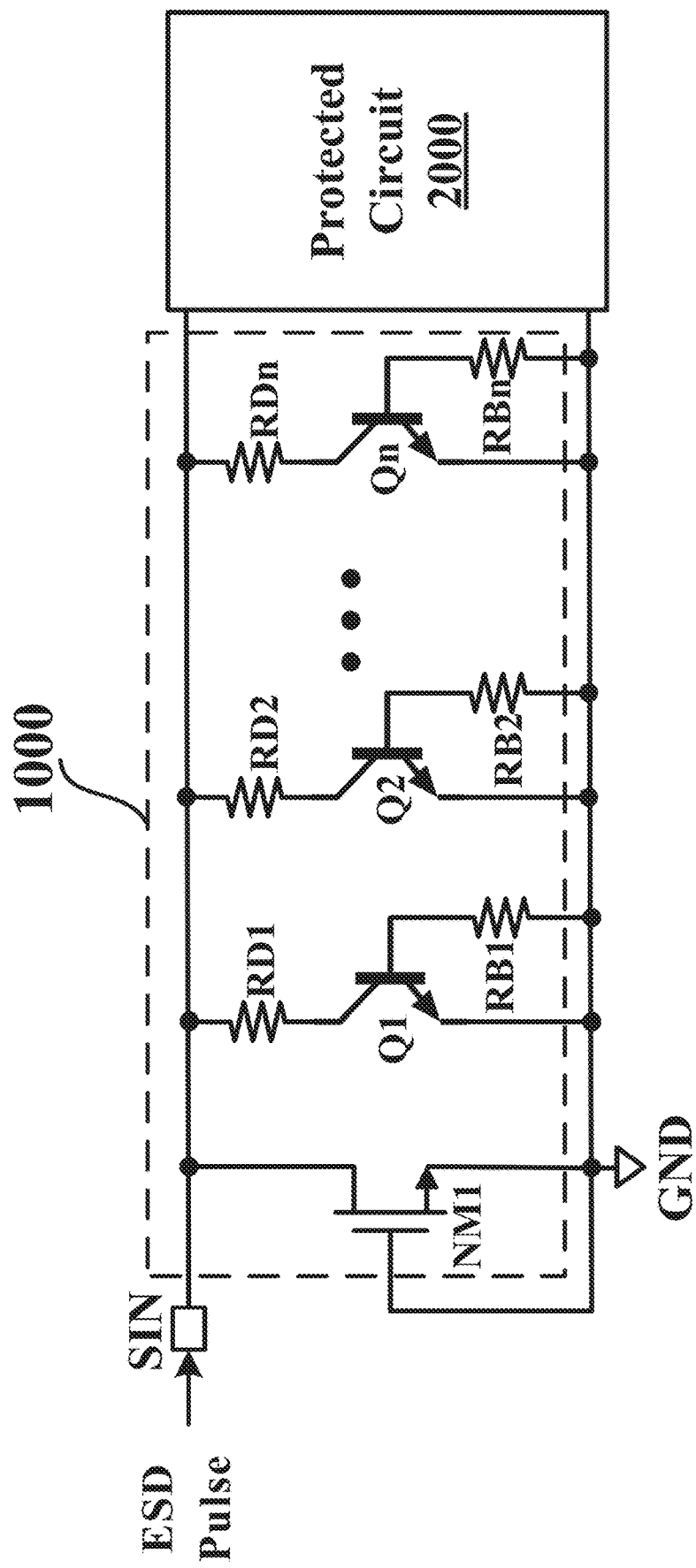
FIG. 3 is a schematic diagram of an electrostatic discharge protection circuit according to an embodiment of the present application.

Reliable snapback requires two conditions. First, the small current generated by impact ionization need to generate a sufficient voltage drop (which, as an example, can be achieved by increasing the resistance between the base and the emitter of the parasitic bipolar transistor QA, i.e. the value of the resistor RB) such that the voltage between the base and the emitter of the parasitic bipolar transistor QA can reach the turn-on voltage of the parasitic bipolar transistor QA. Second, in practical applications, the parasitic bipolar transistor QA in the transistor NM1 can be seen as being composed of multiple parallel parasitic bipolar transistors, as shown in FIG. 3 as an example. In this example, the multiple parallel parasitic bipolar transistors comprise a parasitic bipolar transistor Q1, a parasitic bipolar transistor Q2, . . . , and a parasitic bipolar transistor Qn, where n is an integer greater than 1. Correspondingly, the resistance between the collector of the parasitic bipolar transistor Q1 and the drain of the transistor NM1 is represented as an equivalent resistor RD1, and the resistance between the base of the parasitic bipolar transistor Q1 and the source of the transistor NM1 is represented as an equivalent resistor RB1; the resistor between the collector of the parasitic bipolar transistor Q2 and the drain of the transistor NM1 is represented as an equivalent resistor RD2, and the resistor between the base of the parasitic bipolar transistor Q2 and the source of the transistor NM1 is represented as an equivalent resistor RB2; . . . , the resistor between the collector of the parasitic bipolar transistor Qn and the drain of the transistor NM1 is represented as an equivalent resistor RDn, and the resistor between the base of the parasitic bipolar transistor Qn and the source of the transistor NM1 is represented as an equivalent resistor RBn. A mechanism may be provided for evenly distributing the current among the multiple parasitic bipolar transistors Q1, Q2, . . . , Qn such that each parasitic bipolar transistor can undergo snapback, to prevent the ESD current from concentrating on a single parasitic bipolar transistor undergoing snapback and cause it to overheat and fail.

For example, when one of the parasitic bipolar transistors Q1, Q2, . . . , Qn (e.g., the parasitic bipolar transistor Q1) undergoes snapback due to the drain-source voltage of the transistor NM1 reaching voltage Vd1, the drain-source voltage of the transistor NM1 will be clamped to voltage Vd2. This indirectly prevents the other parasitic bipolar transistors Q2, . . . , Qn from reaching voltage Vd1 and triggering snapback, until the current flowing through the parasitic bipolar transistor Q1 generates a sufficient voltage drop across resistor RD1, which then triggers snapback in the parasitic bipolar transistors Q2, . . . , Qn to share the current of the parasitic bipolar transistor Q1. If the series resistance of the parasitic bipolar transistor Q1 when it is conducting is too small, all the ESD current may flow through the parasitic bipolar transistor Q1, and is not divided, which makes it easy for the parasitic bipolar transistor Q1 to overheat and fail.

To satisfy the above conditions, embodiments of the present application may further configure the structure of the transistor NM1 in order to achieve snapback more reliably and thus provide more reliable ESD protection.

Figure 4:
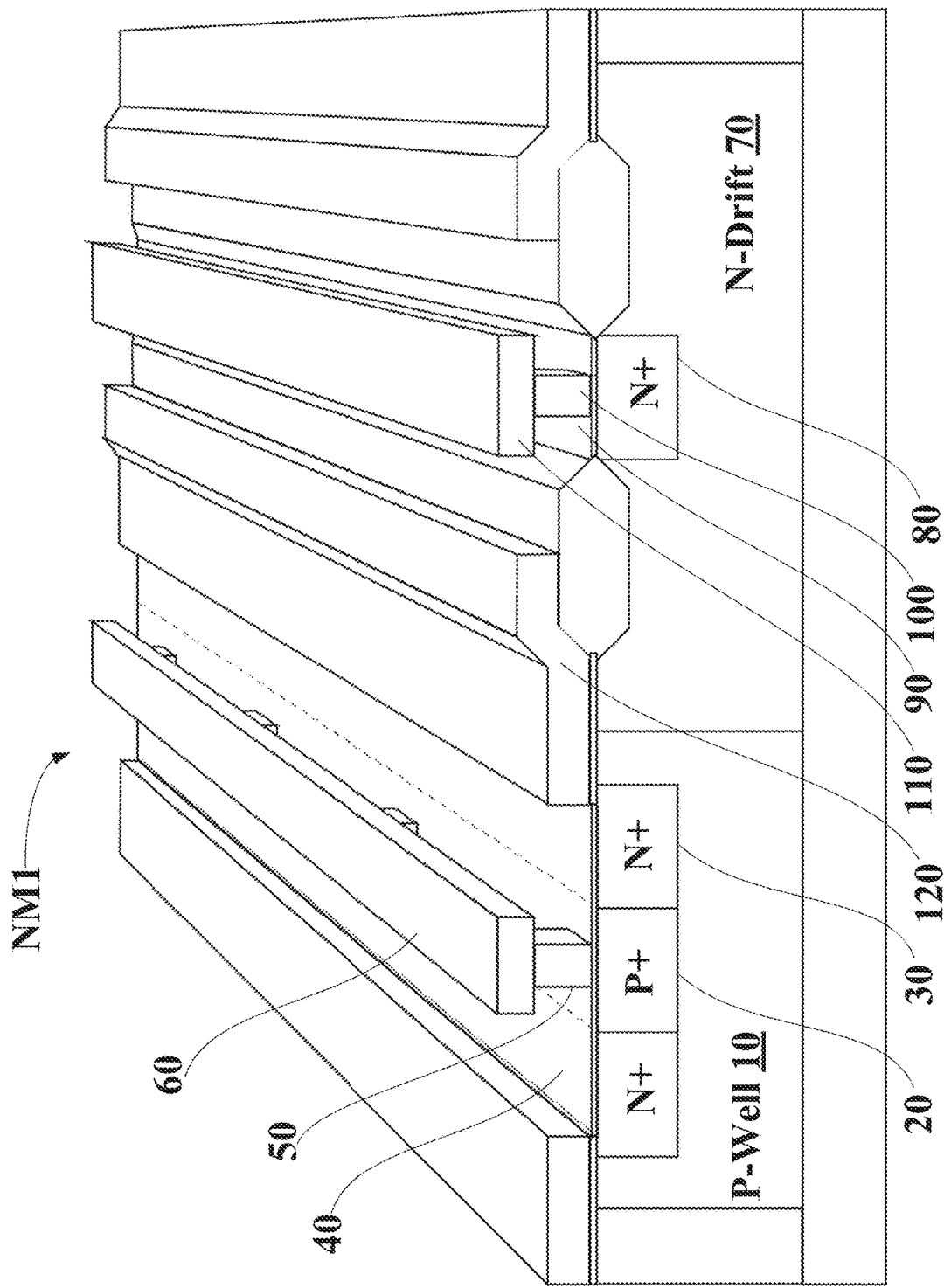
FIG. 4 is a perspective view of a structure of a transistor according to an embodiment of the present application.
Figure 5:
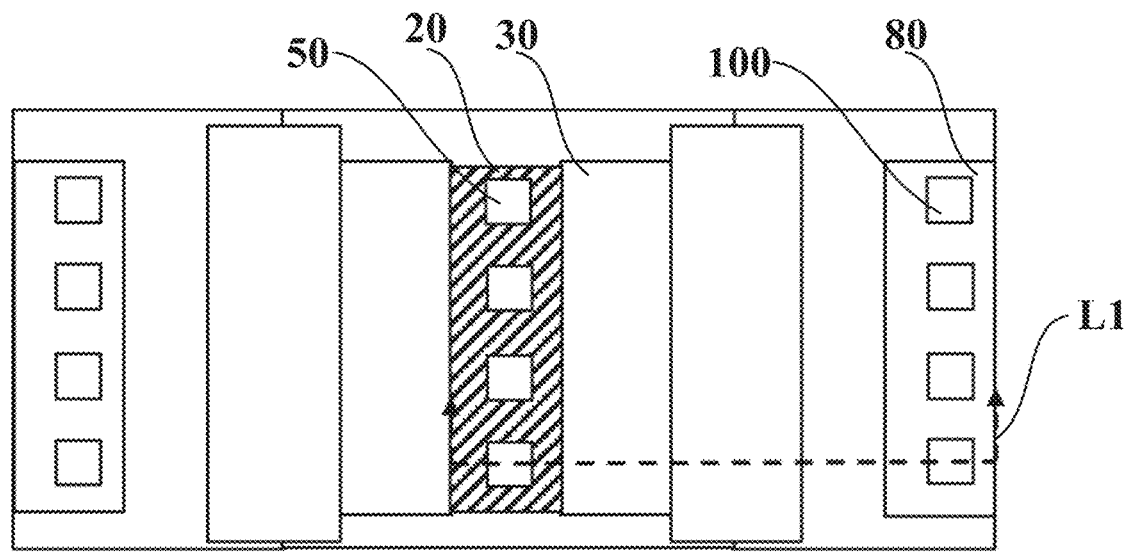
FIG. 5 is a diagram showing a top view and a cross-sectional view corresponding to the transistor shown in FIG. 4.
Figure 5:
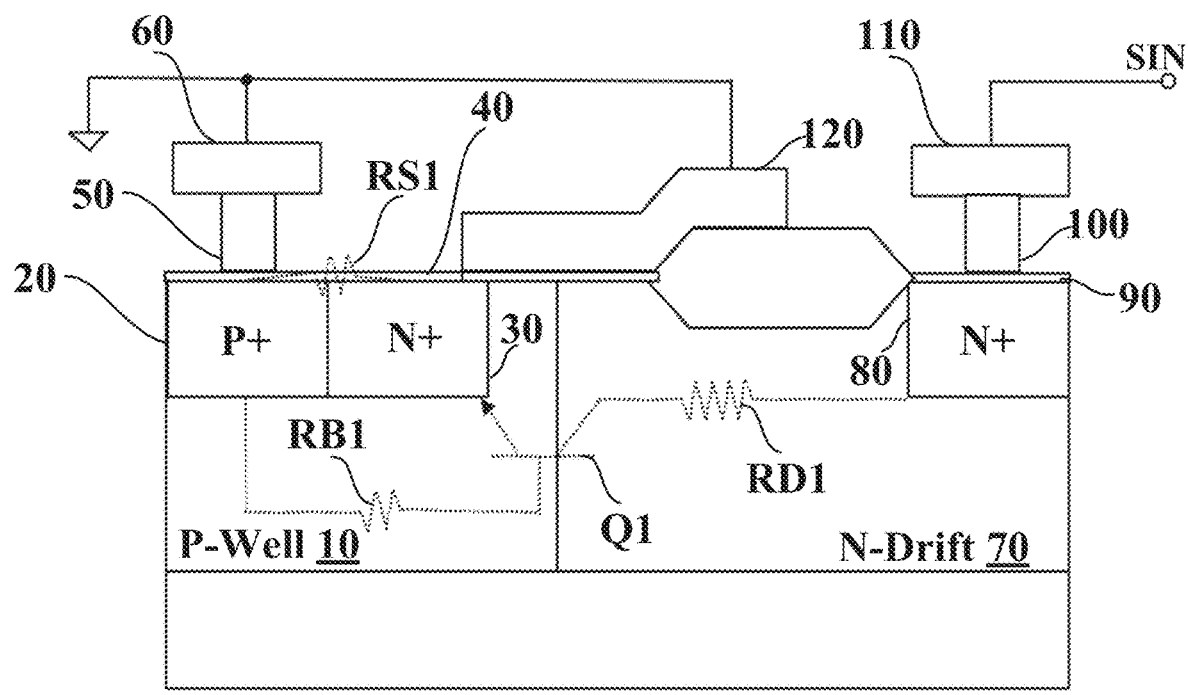

Please refer to FIG. 4 and FIG. 5. FIG. 4 is a perspective view of an example structure of the transistor NM1 provided by the embodiments of the present application, and FIG. 5 shows a top view and a cross-sectional view corresponding to the structure (the transistor NM1) shown in FIG. 4. In FIG. 5, diagram a1 is the top view of the structure after a first metal 60 and a first metal silicide layer 40 are removed; and diagram a2 is the cross-sectional view of the structure obtained by cutting along the dashed line L1 in the diagram a1 and expanding the cut portion which is shown in a planar form.

As shown in FIG. 4, the transistor NM1 comprises a P-type well 10, a body terminal region 20, a source region 30, the first metal silicide layer 40, the first metal 60, and a plurality of first contact structures 50 (four first contact structures 50 are shown in the example).

The body terminal region 20 and the source region 30 are disposed within the P-type well 10, and the body terminal region 20 is adjacent to the source region 30. The body terminal region 20 is a heavily doped P-type region, and the source region 30 is a heavily doped N-type region. The first metal silicide layer 40 is disposed on the surfaces of the body terminal region 20 and the source region 30 and is separately and electrically connected to the body terminal region 20 and the source region 30. During the manufacturing process of the transistor NM1, to better achieve electrical connections between the contact structures and the diffusion regions on a silicon wafer (such as the source region 30, the body terminal region 20, and a drain region 80), a metal silicide layer may be grown on the silicon surface (such as the surfaces of the source region 30, body terminal region 20, and drain region 80). This metal silicide layer has conductivity higher than the P-type well 10 but lower than the metal layer. As an example, the first metal silicide layer 40 is the metal silicide layer grown on the surfaces of the body terminal region 20 and the source region 30 during the manufacturing process of the transistor. The first metal 60 is electrically connected to only the portion of the first metal silicide layer 40 that is on the surface of the body terminal region 20 through the plurality of first contact structures 50 to increase the resistance between the emitters of each parasitic bipolar transistor (including e.g., the parasitic bipolar transistors Q1, Q2, . . . , Qn) and the body terminal region 20.

In this embodiment, the transistor NM1 may further comprise an N-type drift region 70, the drain region 80 disposed within the N-type drift region 70, a second metal silicide layer 90, a second metal 110, a plurality of second contact structures 100 (four second contact structures 100 are shown in FIG. 5 as an example), and a gate region 120. The second metal silicide layer 90 is the metal silicide layer grown on the surface of the drain region 80 during the manufacturing process of the transistor.

The drain region 80 is electrically connected to the second metal 110 through the second metal silicide layer 90 and the plurality of second contact structures 100.

FIG. 5 exemplarily shows the structure of the parasitic bipolar transistor Q1 of the transistor NM1, and the structure of other parasitic bipolar transistors (e.g., the parasitic bipolar transistors Q2, . . . , Qn) is similar to that of the parasitic bipolar transistor Q1, which is within the scope readily understood by those ordinarily skilled in the art and will not be detailed here.

In some embodiments, the PN junction between the base and emitter of the parasitic bipolar transistor Q1 is located between the P-type well 10 and the source region 30, and the PN junction between the base and collector of the parasitic bipolar transistor Q1 is located between the P-type well 10 and the N-type drift region 70. The base of the parasitic bipolar transistor Q1 is electrically connected to the body terminal region 20 through the distributed resistance within the P-type well 10 represented by the equivalent resistor RB1, and the collector of the parasitic bipolar transistor Q1 is electrically connected to the drain region 80 through the distributed resistance within the N-type drift region 70 represented by the equivalent resistor RD1. The source region 30 of the transistor NM1 is the emitter of the parasitic bipolar transistor Q1. When the source region 30 and the body terminal region 20 are electrically connected only through the first metal silicide layer 40, the distributed resistance of the first metal silicide layer 40 is represented by an equivalent series resistor RS1 between the emitter of the parasitic bipolar transistor Q1 and the body terminal region 20. It should be noted that RS1, RB1, and RD1 are all distributed resistors within the materials, where RS1 is determined by the conductivity and shape of the first metal silicide layer 40, and RB1 and RD1 are determined by the doping concentration, size and shape of the P-type well 10 and the N-type drift region 70, respectively.

Figure 6:
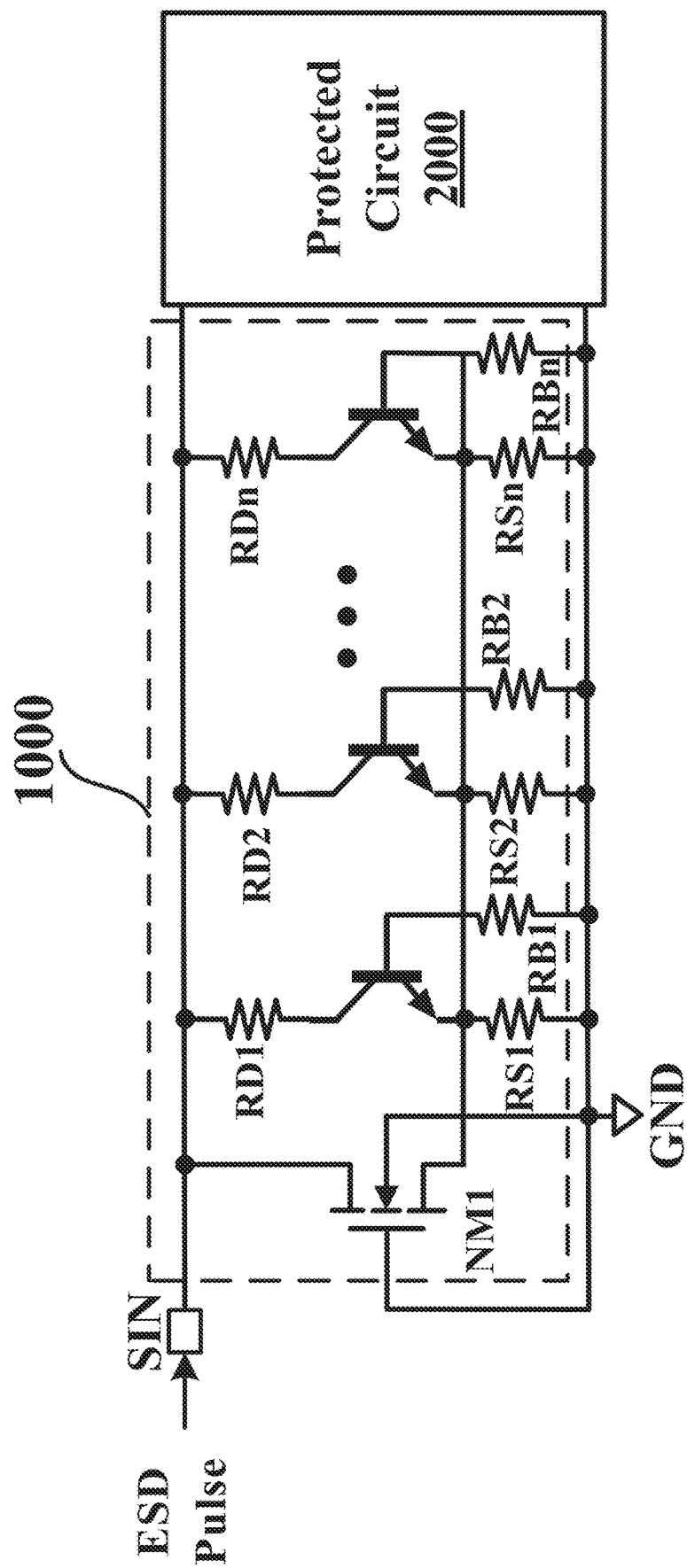
FIG. 6 is a schematic diagram of a circuit structure obtained by applying the transistor shown in FIG. 4 and FIG. 5 to the circuit structure shown in FIG. 3.

Applying the structure of the transistor NM1 shown in FIG. 4 and FIG. 5 to the structure shown in FIG. 3 results in the circuit structure shown in FIG. 6. As shown in FIG. 6, the gate and the body terminal of the transistor NM1 are connected to the ground, corresponding to the gate region 120 and the body terminal region 20 shown in the diagram a2 of FIG. 5 being connected to the ground. The source of the transistor NM1 is electrically connected to the ground through distributed resistances represented by resistors RS1, RS2, . . . , RSn, corresponding to the source region 30 shown in the diagram a2 of FIG. 5 being connected to the ground through the first metal silicide layer 40, the first contact structures 50, and the first metal 60. The drain of the transistor NM1 is connected to the signal input terminal SIN, corresponding to the drain region 80 shown in the diagram a2 of FIG. 5 being connected to the signal input terminal SIN through the second metal silicide layer 90, the second contact structures 100, and the second metal 110.

Each emitter of the parasitic bipolar transistors is electrically connected to the ground through a corresponding equivalent resistor. Specifically, the emitter of the parasitic bipolar transistor Q1 is connected to the ground through the resistor RS1, the emitter of the parasitic bipolar transistor Q2 is connected to the ground through the resistor RS2, and so on, with the emitter of the parasitic bipolar transistor Qn being connected to the ground through the resistor RSn.

When one parasitic bipolar transistor (e.g., the parasitic bipolar transistor Q1) undergoes snapback, the addition of the resistor RS1 causes the voltage at the signal input terminal SIN by the current flowing through the parasitic bipolar transistor Q1 to be higher than the voltage at the signal input terminal SIN by the circuit shown in FIG. 3. As the current flowing through the parasitic bipolar transistor Q1 increases, the voltage at the signal input terminal SIN increases more rapidly, helping other parasitic bipolar transistors (including the parasitic bipolar transistors Q2, . . . , Qn) reach voltage Vd1 and enter snapback to share the current of the parasitic bipolar transistor Q1, which thus prevents the parasitic bipolar transistor Q1 from overheating and failing. Additionally, the increase in the voltage across the resistor RS1 can reduce the voltage between the base and emitter of the parasitic bipolar transistor Q1, and forms a negative feedback to limit the rapid increase in the current through the parasitic bipolar transistor Q1, thus preventing the parasitic bipolar transistor Q1 from overheating and failing due to a rapid increase in current.

In the structure shown in FIG. 4, an example is shown where the body terminal region 20 is configured to be adjacent to the source region 30, and the body terminal region 20 and the source region 30 are continuous and arranged next to each other. The body terminal region 20 and the source region 30 each may be a continuous region.

Figure 7:
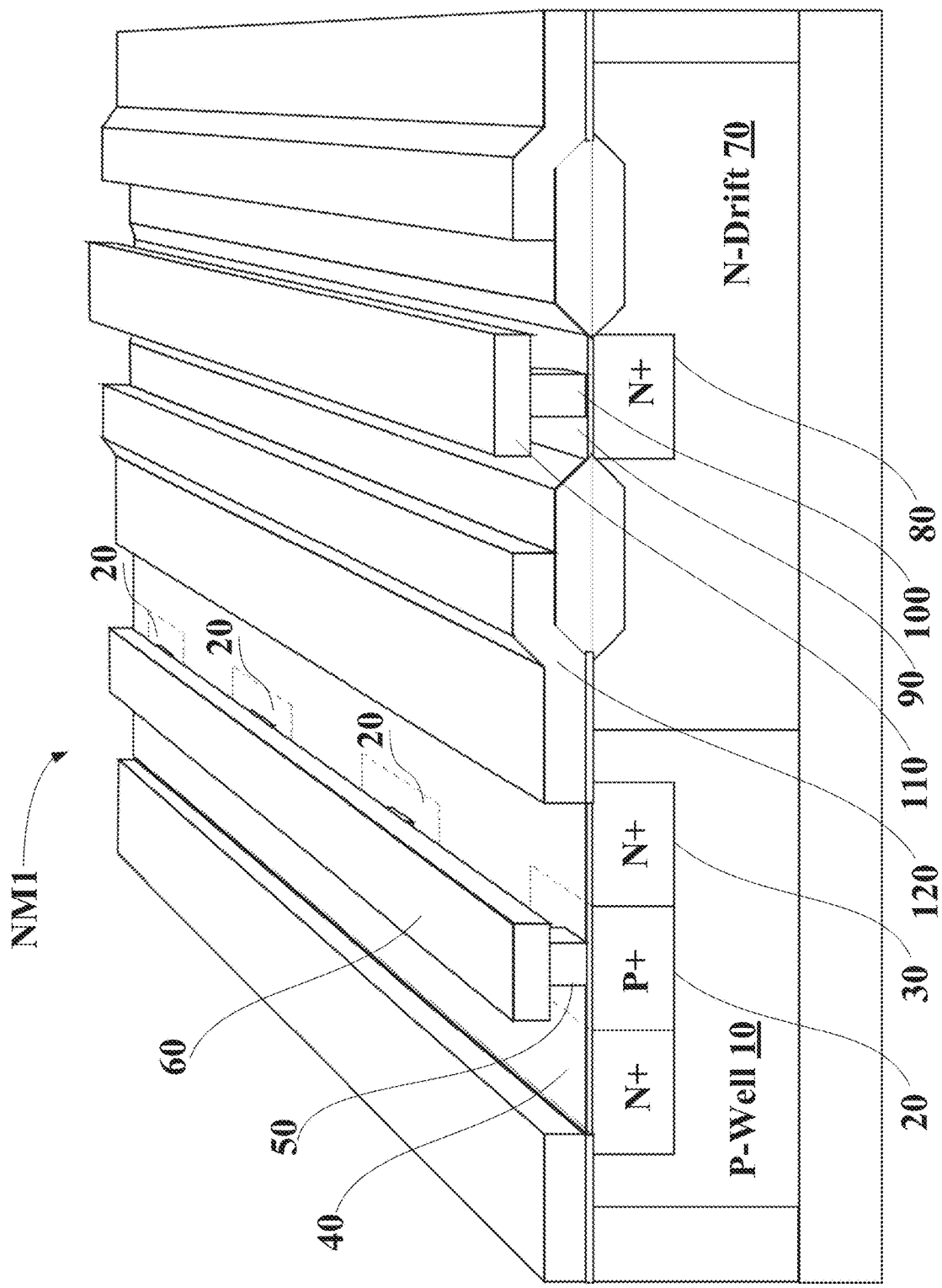
FIG. 7 is a perspective view of a structure of a transistor according to another embodiment of the present application.
Figure 8:
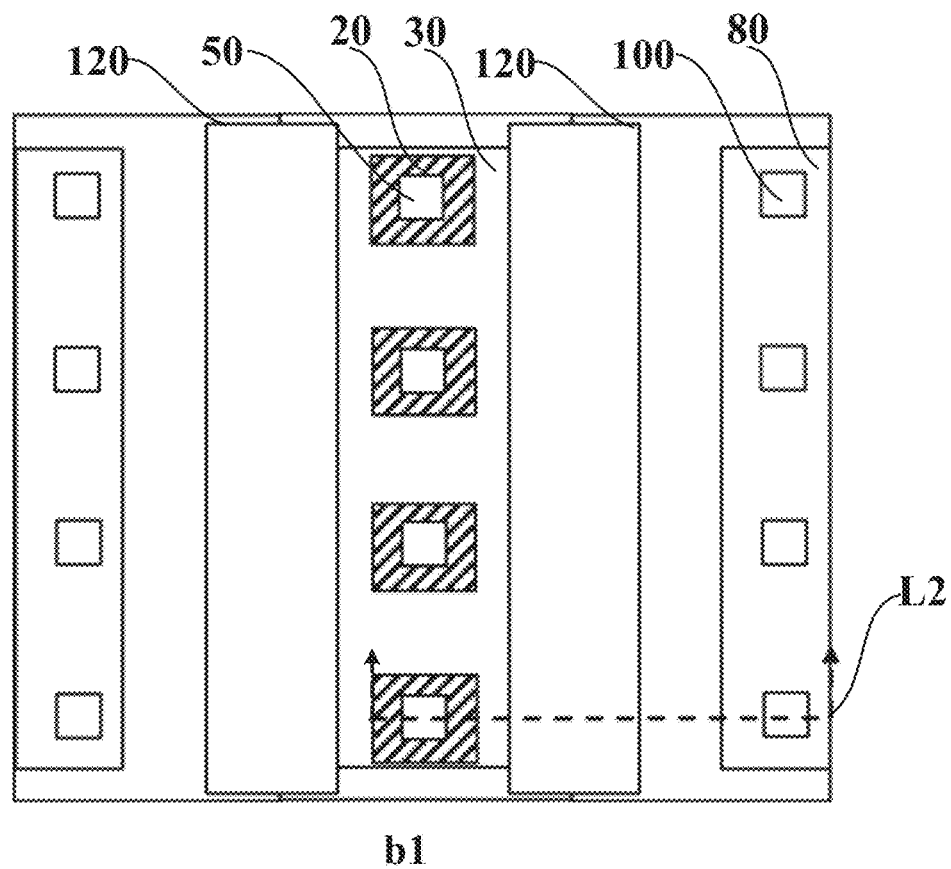
FIG. 8 is a diagram showing a top view and a cross-sectional view corresponding to the transistor shown in FIG. 7.
Figure 8:
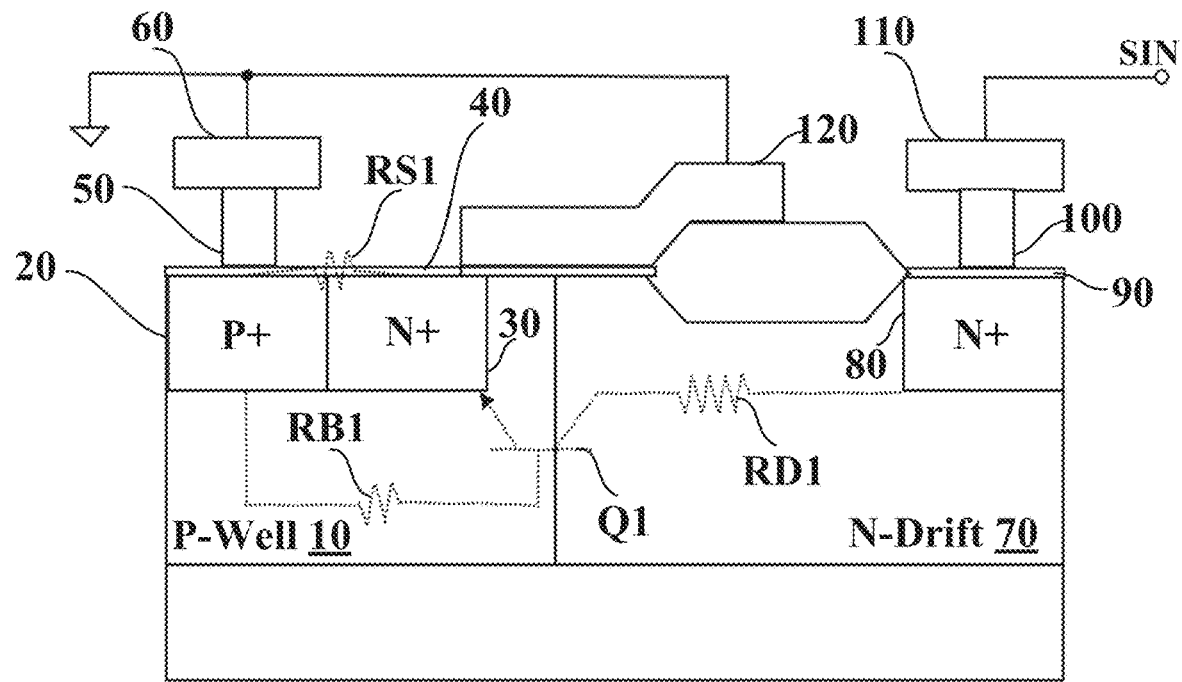

In other embodiments, in a specific implementation for configuring the body terminal region 20 to be adjacent to the source region 30, the body terminal region 20 may be discontinuous and embedded within the source region 30, and the body terminal region 20 is surrounded by the source region 30, as shown in FIG. 7 and FIG. 8. That is, the body terminal region 20 may be a region including multiple portions discontinuous with each other, or including multiple separate portions. FIG. 7 is a perspective view of another example structure of the transistor NM1 provided by the embodiments of the present application, and FIG. 8 shows a top view and a cross-sectional view corresponding to the structure (the transistor NM1) shown in FIG. 7. In FIG. 8, diagram b1 is the top view of the structure after the first metal 60 and the first metal silicide layer 40 are removed; and diagram b2 is the cross-sectional view of the structure obtained by cutting along the dashed line L2 in the diagram b1 and expanding the cut portion which is shown in a planar form. As shown, the body terminal region 20 includes multiple portions that are separated from each other and embedded in the source region 30. By embedding the body terminal region 20 within the source region 30, the structure of the transistor NM1 can be made more compact, which enables to make more efficient use of the width of the source region to save chip area. The specific implementation process of FIG. 7 and FIG. 8 is the same as or similar to that of FIG. 4 and FIG. 5, which can be referred to for detailed description, and will not be repeated here.

In some embodiments, the shape of the first metal silicide layer 40 may be adjusted in order to control the distributed resistance between the source region 30 and the body terminal region 20, e.g., adjusting the resistance of the equivalent resistor RS1 to optimize the ESD protection process.

In some embodiments, the shape of the first metal silicide layer 40 may be formed using a mask process to achieve different aspect ratios and resistance values of the first metal silicide layer 40, thereby adjusting the snapback voltages Vd1 and Vd2.

Figure 9:
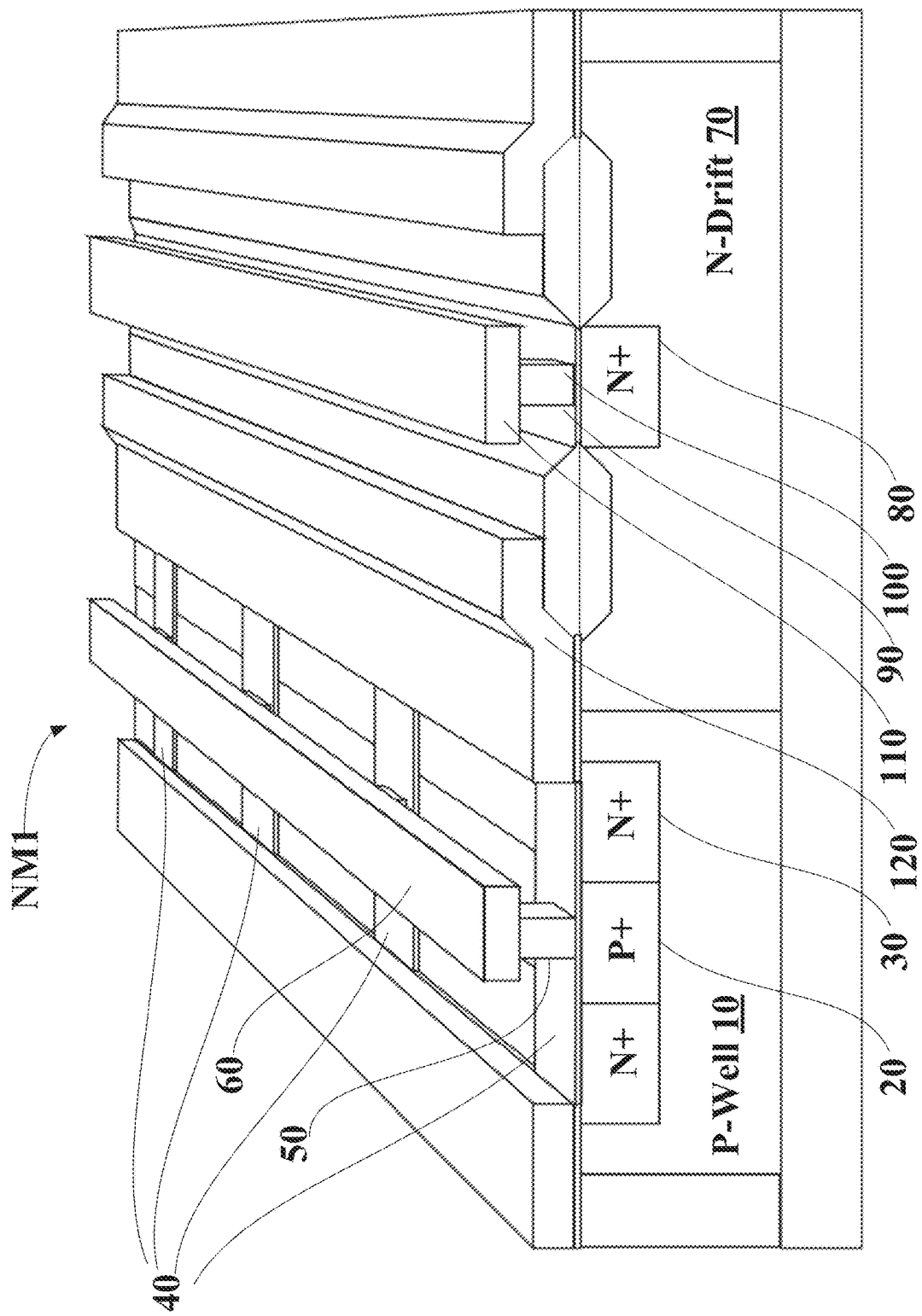
FIG. 9 is a perspective view of a structure of a transistor according to yet another embodiment of the present application.

As an example, FIG. 9 shows an approach to adjust the shape of the first metal silicide layer 40 based on the transistor structure shown in FIG. 4. As shown in FIG. 9, the resistance value of the equivalent resistor connecting the body terminal region 20 and the source region 30 may be adjusted by shaping the first metal silicide layer 40. In the transistor structure shown in FIG. 4 and FIG. 5, the equivalent resistor RS1 is used in the circuit to restrict the current flow horizontally between the source region 30 and the body terminal region 20, and the resistance value of the resistor RS1 is inversely proportional to the width of the first metal silicide 40. By reducing the width of the first metal silicide Layer 40, e.g., shaping horizontally (in a direction along the length of the transistor NM1) the first metal silicide Layer 40 from being a continuous one-piece layer (as shown in FIG. 4) to being a layer comprised of separated strips (as shown in FIG. 9), can significantly increase the resistance of the equivalent resistor RS1. This promotes more snapbacks to occur among the parasitic bipolar transistors Q2, . . . , Qn and more even distribution of the current after snapback occurs.

Figure 10:
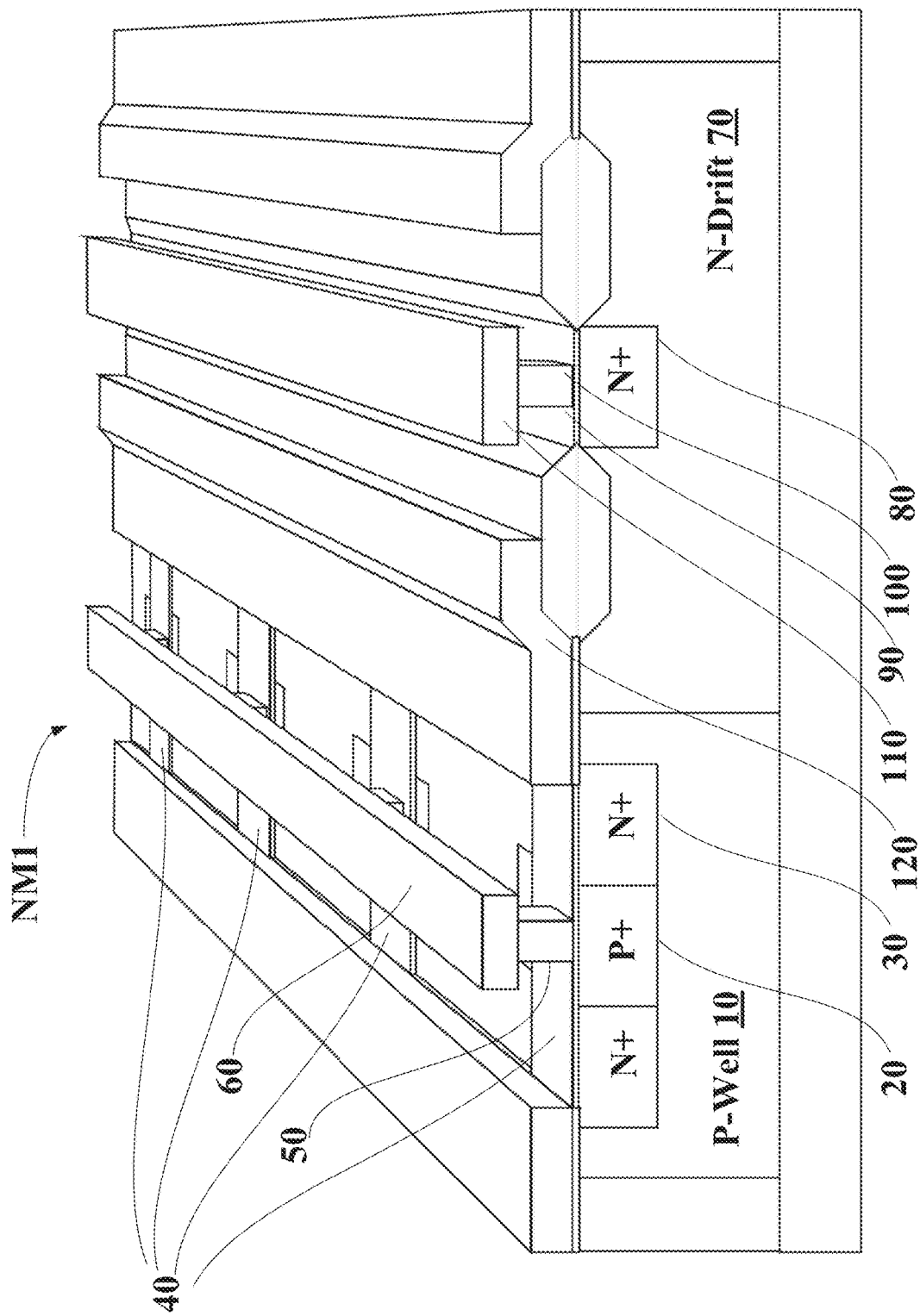
FIG. 10 is a perspective view of a structure of a transistor according to yet another embodiment of the present application.

As another example, FIG. 10 shows an approach to adjust the shape of the first metal silicide layer 40 based on the transistor structure shown in FIG. 7. As shown in FIG. 10, the resistance value of the equivalent resistor connecting the body terminal region 20 and the source region 30 may be adjusted by shaping the first metal silicide layer 40 horizontally.

Figure 11:
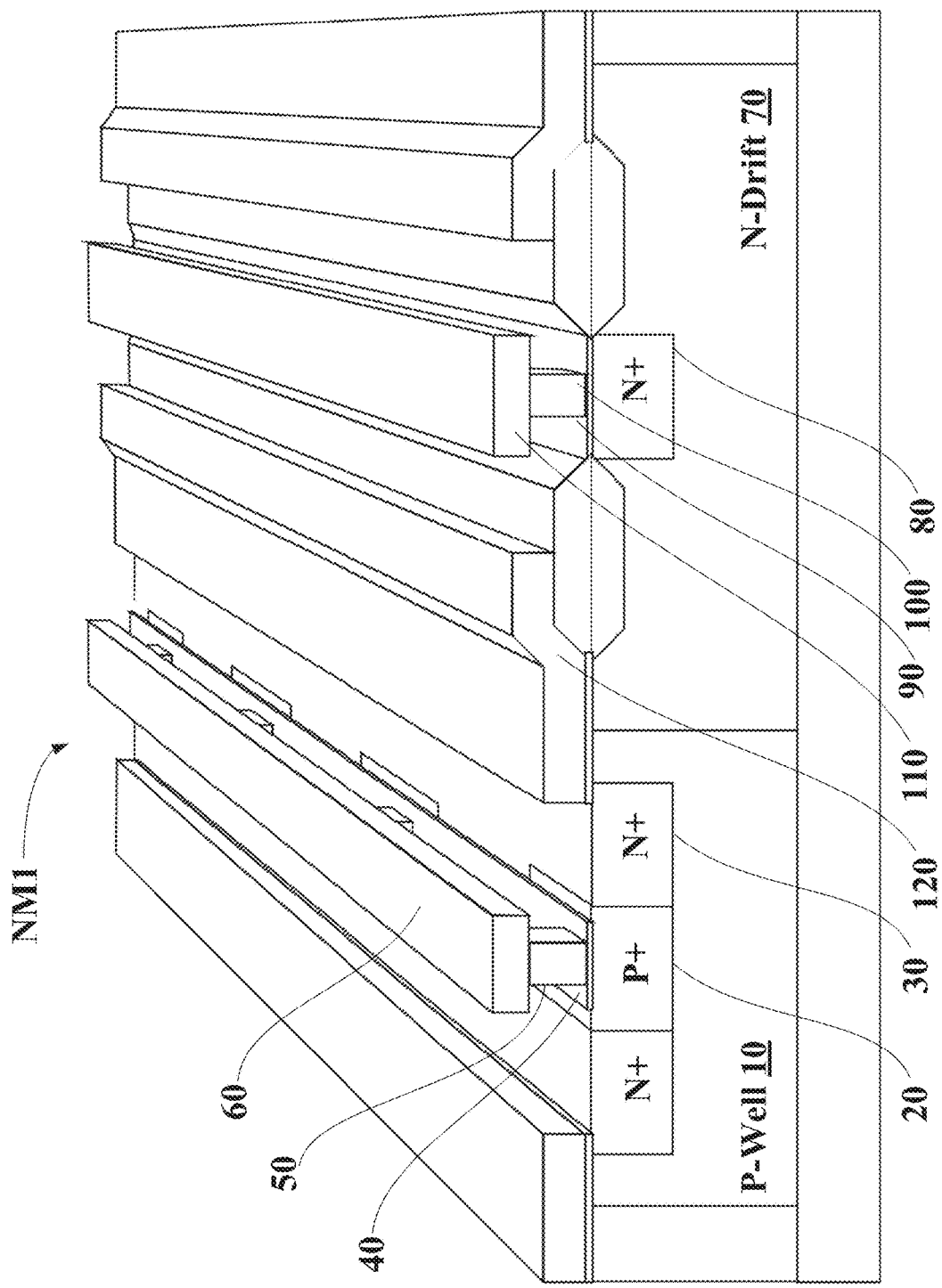
FIG. 11 is a perspective view of a structure of another transistor according to another embodiment of the present application.

Furthermore, FIG. 11 shows another example approach to adjust the shape of the first metal silicide layer 40 based on the structure shown in FIG. 7. As shown in FIG. 11, the resistance value of the resistor connecting the body terminal region 20 and the source region 30 may be adjusted by shaping the first metal silicide layer 40 longitudinally.

In the structures shown in FIG. 4 to FIG. 11, the first contact structures 50 are exemplarily shown to be disposed on the surface of the body terminal region 20 only. However, the embodiments of the present application also provide another similar solution to more reliably achieve ESD protection.

Figure 12:
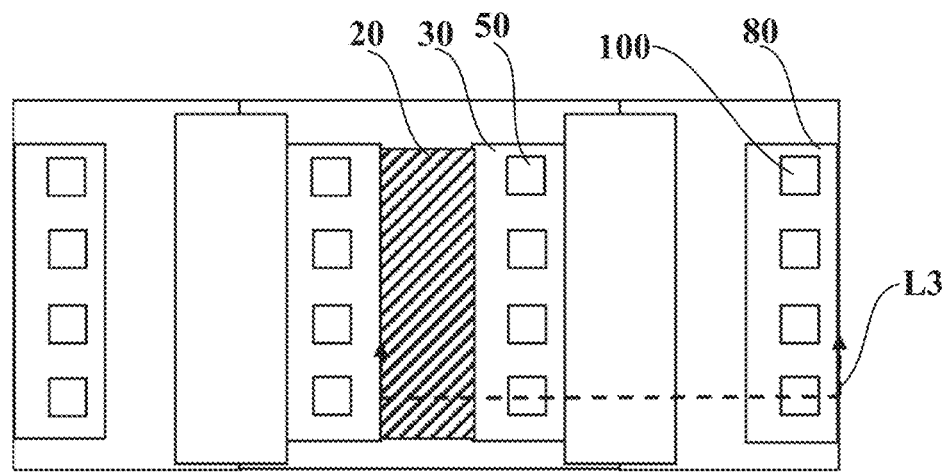
FIG. 12 is a diagram showing a top view and a cross-sectional view of a transistor in which a first metal is electrically connected only to part of a first metal silicide layer located on a surface of a source region through a plurality of first contact structures.
Figure 12:
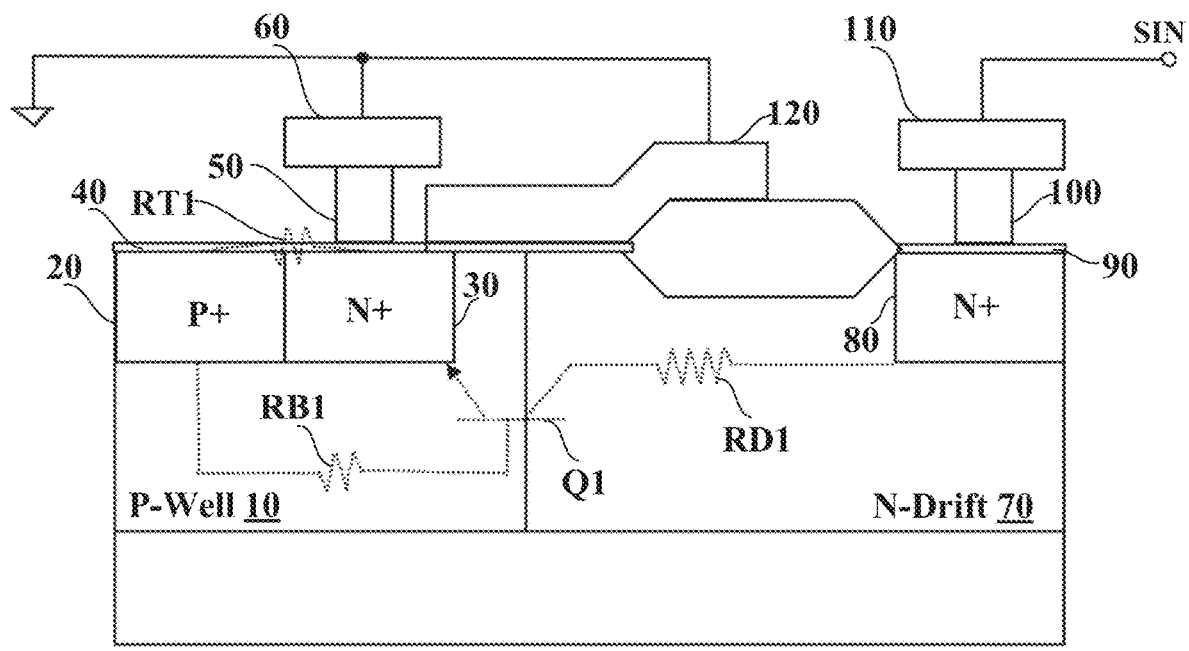

Specifically, refer to FIG. 12, which exemplarily shows a structure of the parasitic bipolar transistor Q1 of the transistor NM1. The structure of other parasitic bipolar transistors (including parasitic bipolar transistors Q2, . . . , Qn) is similar to that of the parasitic bipolar transistor Q1, and is within the scope readily understood by those ordinarily skilled in the art, which will not be repeated here. FIG. 12 shows a cross-sectional view c2 similar to the diagram a2 of FIG. 5. The difference between the transistor NM1 shown in FIG. 12 and the transistor NM1 shown in FIG. 5 is that, FIG. 5 shows that the first metal 60 is electrically connected only to a portion of the first metal silicide layer 40 that is on the surface of the body terminal region 20 through the plurality of first contact structures 50, which increases the resistance between the emitter of each parasitic bipolar transistor and the body terminal region 20; while FIG. 12 shows that the first metal 60 is electrically connected only to a portion of the first metal silicide layer 40 on the surface of the source region 30 through the plurality of first contact structures 50, which increases the resistance between the base of each parasitic bipolar transistor and the source region 30.

Figure 13:
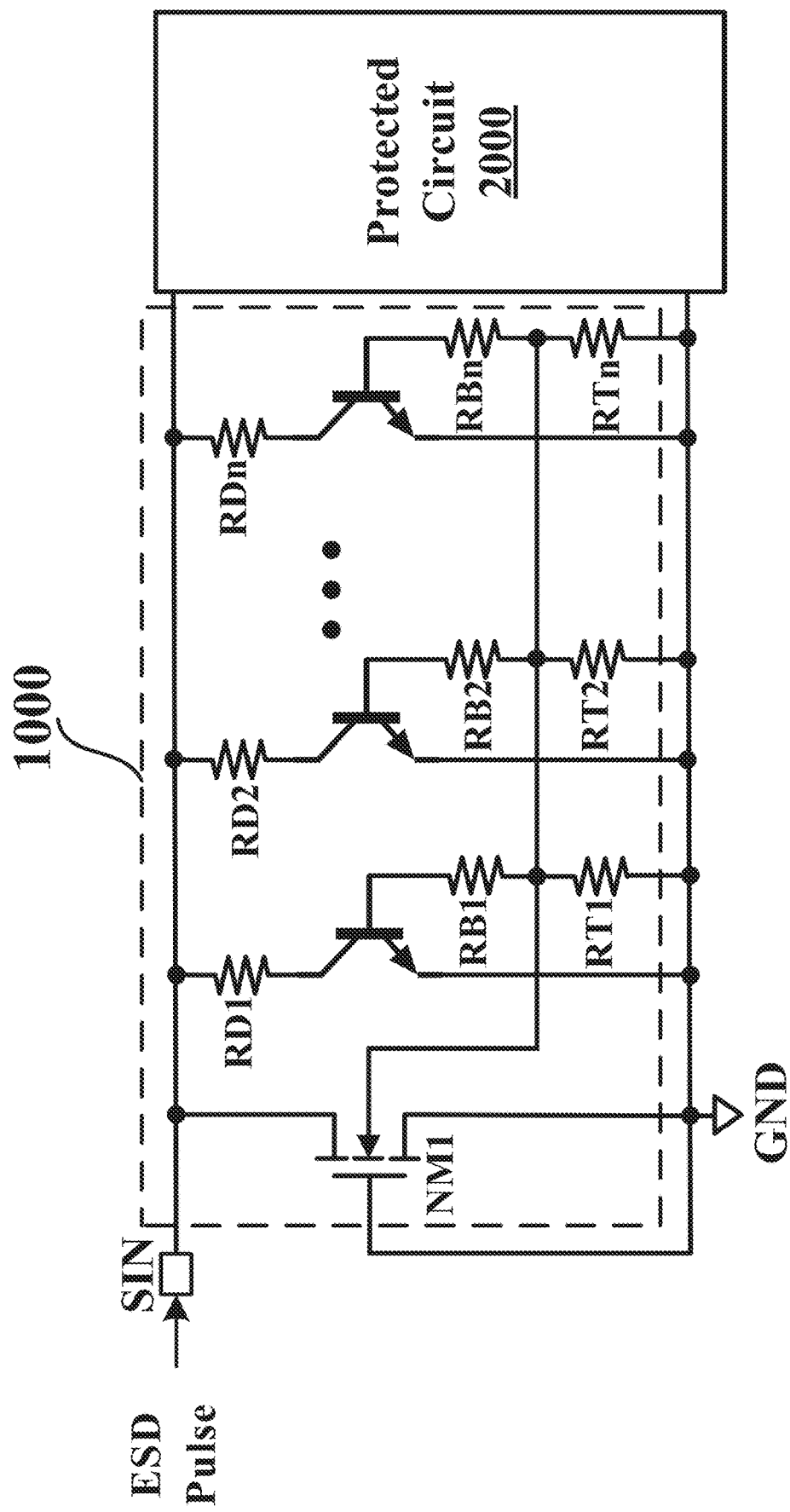
FIG. 13 is a schematic diagram of a circuit structure of an electrostatic discharge protection circuit according to another embodiment of the present application.

Applying the structure of the transistor NM1 shown in FIG. 12 to the structure shown in FIG. 3 results in a circuit structure shown in FIG. 13. As shown in FIG. 13, the gate of the transistor NM1 is connected to the ground, corresponding to the gate region 120 shown in FIG. 12 being connected to the ground. The source of the transistor NM1 is connected to the ground, corresponding to the source region 30 shown in FIG. 12 being connected to the ground through the first metal silicide layer 40, the first contact structures 50, and the first metal 60. The body terminal of the transistor NM1 is connected to the source through an equivalent resistor RT1, representing the resistance between the body terminal region 20 shown in FIG. 12 and the source region 30 through the first metal silicide layer 40. The drain of the transistor NM1 is connected to the signal input terminal SIN, corresponding to the drain region 80 shown in FIG. 12 being connected to the signal input terminal SIN through the second metal silicide layer 90, the second contact structures 100, and the second metal 110.

Each base of the parasitic bipolar transistors is connected to the ground through a series connection of two resistors. Specifically, the base of the parasitic bipolar transistor Q1 is connected to the ground through the series connection of the equivalent resistor RB1 and the equivalent resistor RT1, corresponding to the distributed resistance within the P-type well 10 (represented by the resistor RB1) and the distributed resistance within the first metal silicide layer shown in FIG. 12 (represented by the resistor RT1). The base of the parasitic bipolar transistor Q2 is connected to the ground through the series connection of resistor RB2 and resistor RT2, and so on, with the base of the parasitic bipolar transistor Qn being connected to the ground through the series connection of resistor RBn and resistor RTn. Each emitter of the parasitic bipolar transistors is connected to the ground.

In this embodiment, by serially adding the equivalent resistors, i.e., RT1, RT2, . . . , RTn, between the base and emitter of each parasitic bipolar transistor, the resistance between the base and emitter of each parasitic bipolar transistor can be increased, making it easier for each parasitic bipolar transistor to reach the corresponding snapback voltage Vd1 when an ESD pulse is applied to the signal input terminal SIN, thereby achieving more reliable ESD protection.

It is understood that the circuit structures shown in FIG. 1, FIG. 2, FIG. 6, and FIG. 7 are suitable for applications where the ESD pulse is positive only. The subsequent embodiments of the present application provide an ESD protection circuit suitable for applications where the ESD pulse can be positive or negative.

Figure 14:
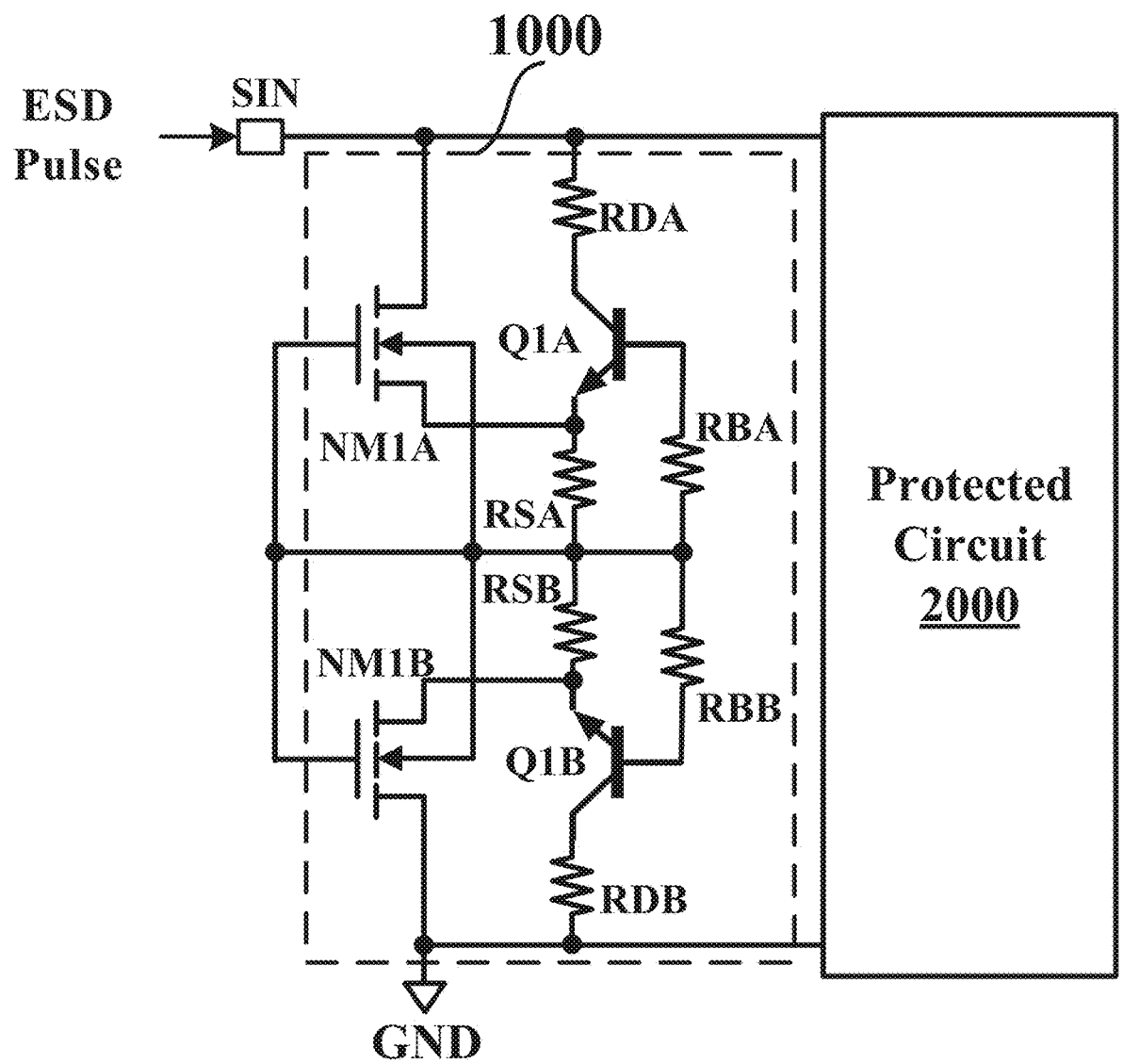
FIG. 14 is a schematic diagram of a circuit structure of an electrostatic discharge protection circuit according to yet another embodiment of the present application.
Figure 15:
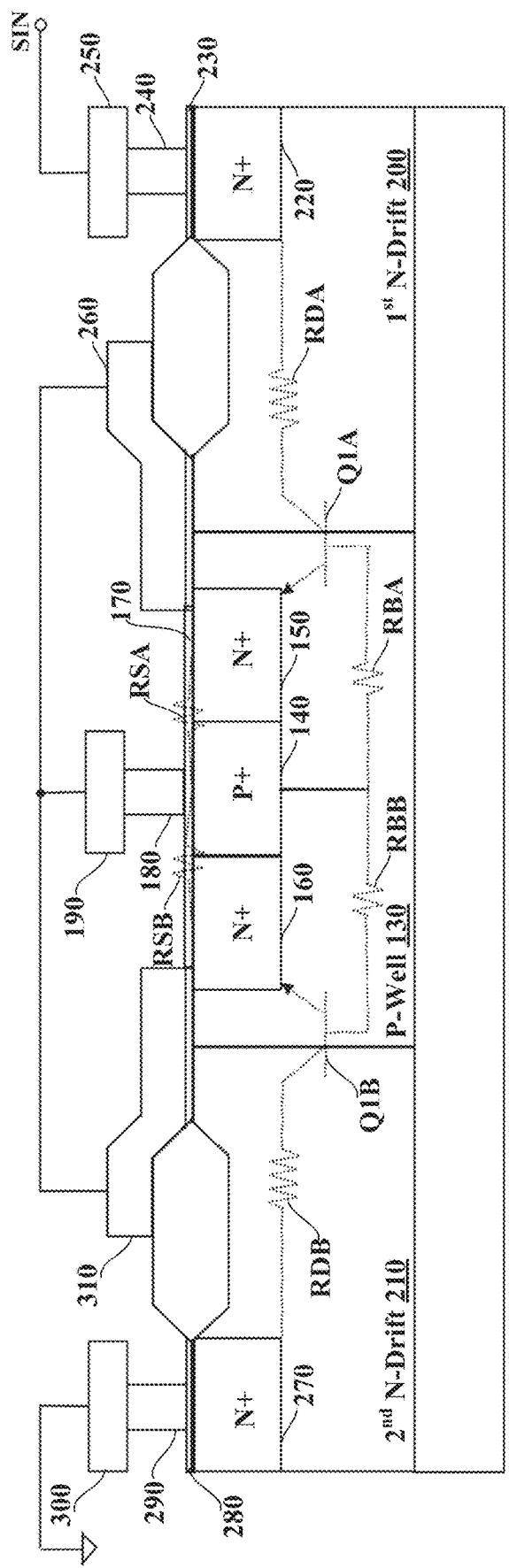
FIG. 15 is a cross-sectional view of a back-to-back transistor according to an embodiment of the present application.

Referring to FIG. 14 and FIG. 15, FIG. 14 is another example circuit structure of the ESD protection circuit 1000 provided by the embodiments of the present application, and FIG. 15 is a cross-sectional view of back to back transistors (including a transistor NM1A and a transistor NM1B) in the structure shown in FIG. 14. It is noted that in this embodiment, only one group of parasitic bipolar transistors (including a first parasitic bipolar transistor Q1A and a second parasitic bipolar transistor Q1B) is exemplarily shown. However, in practical applications, multiple groups of parasitic bipolar transistors can be arranged in parallel similar to the manner shown in FIG. 3. For the specific implementation process, reference can be made to the description of FIG. 3, which is within the scope readily understood by those ordinarily skilled in the art and will not be repeated here.

As shown in FIG. 14 and FIG. 15, the back to back transistors comprise a P-type well 130, a body terminal region 140, a source region, a first metal silicide layer 170, a first metal 190, and a plurality of first contact structures 180.

The body terminal region 140 and the source region are disposed within the P-type well 130, and the body terminal region 140 is adjacent to the source region. The source region comprises a first source sub-region 150 and a second source sub-region 160, and the body terminal region 140 is disposed between the first source sub-region 150 and the second source sub-region 160.

The first metal silicide layer 170 is disposed on the surfaces of the body terminal region 140, the first source sub-region 150 and the second source sub-region 160 and is electrically connected to the body terminal region 140, the first source sub-region 150 and the second source sub-region 160, separately.

The first metal 190 may only be electrically connected to a portion of the first metal silicide layer 170 that is on the surface of the body terminal region 140 through the plurality of first contact structures 180, which increases the resistance between the emitter of the first parasitic bipolar transistor Q1A and the body terminal region 140 and the resistance between the emitter of the second parasitic bipolar transistor Q1B and the body terminal region 140.

In this embodiment, the back to back transistors further comprise a first N-type drift region 200, a second N-type drift region 210, a first drain region 220 disposed within the first N-type drift region 200, a second metal silicide layer 230, a plurality of second contact structures 240, a second metal 250, a first gate region 260, a second drain region 270 disposed within the second N-type drift region 210, a third metal silicide layer 280, a plurality of third contact structures 290, a third metal 300, and a second gate region 310.

The first drain region 220 is electrically connected to the second metal 250 through the second metal silicide layer 230 and the plurality of second contact structures 240. The second metal 250 is connected to the signal input terminal SIN. The second drain region 270 is electrically connected to the third metal 300 through the third metal silicide layer 280 and the plurality of third contact structures 290. The third metal 300 is connected to the ground. The first metal 190 is further connected to the first gate region 260 and the second gate region 310, i.e., the first metal 190 is short-circuited to the gates of both transistors (including the gate of the transistor NM1A and the gate of the transistor NM1B).

The PN junction between the base and emitter of the first parasitic bipolar transistor Q1A is located between the P-type well 130 and the first source sub-region 150. The PN junction between the base and emitter of the second parasitic bipolar transistor Q1B is located between the P-type well 130 and the second source sub-region 160. The PN junction between the base and collector of the first parasitic bipolar transistor Q1A is located between the P-type well 130 and the first N-type drift region 200. The PN junction between the base and collector of the second parasitic bipolar transistor Q1B is located between the P-type well 130 and the second N-type drift region 210.

Specifically, when the operating voltage of the signal input terminal SIN can be either positive or negative, such as when the operating voltage of the signal input terminal SIN is an AC signal, the back to back transistors in this embodiment can provide ESD protection for the signal input terminal SIN to prevent the negative voltage during normal operation from being clamped by the body diode of the transistor NM1A. The back to back transistors are connected in a common-source common-gate configuration between the signal input terminal SIN and the ground GND. When an ESD pulse is applied to the terminal SIN, the transistor NM1A undergoes snapback, and the transistor NM1A together with the body diode of the transistor NM1B (the PN junction between the base and collector of the second parasitic bipolar transistor Q1B conducts) clamps the voltage between the signal input terminal SIN and the ground GND. However, during normal operation, if the signal input terminal SIN experiences a sustained or slowly varying negative voltage, this ESD protection circuit 1000 will not be activated, thereby not affecting the normal negative voltage input and output of the signal input terminal SIN.

It is understood that in the back to back transistors shown in FIG. 14 and FIG. 15, the body terminal region 140 being adjacent to the source region may also be implemented in other ways. The following provides two example ways. One way is configure the body terminal region 140 and the source region to be continuously and adjacently arranged; and another way is to configure the body terminal region 140 to be discontinuous and embedded within the source region, with the body terminal region 140 surrounded by the source region. The specific implementation is the same as those described for FIG. 4, which is within the scope readily understood by those ordinarily skilled in the art and will not be repeated here.

Similarly to those described above, the shape of the first metal silicide layer 170 may be adjusted to control the resistance between the source region and the body terminal region 140, such as adjusting the resistances of resistors RSA and RSB, to optimize the ESD protection process.

Figure 16:
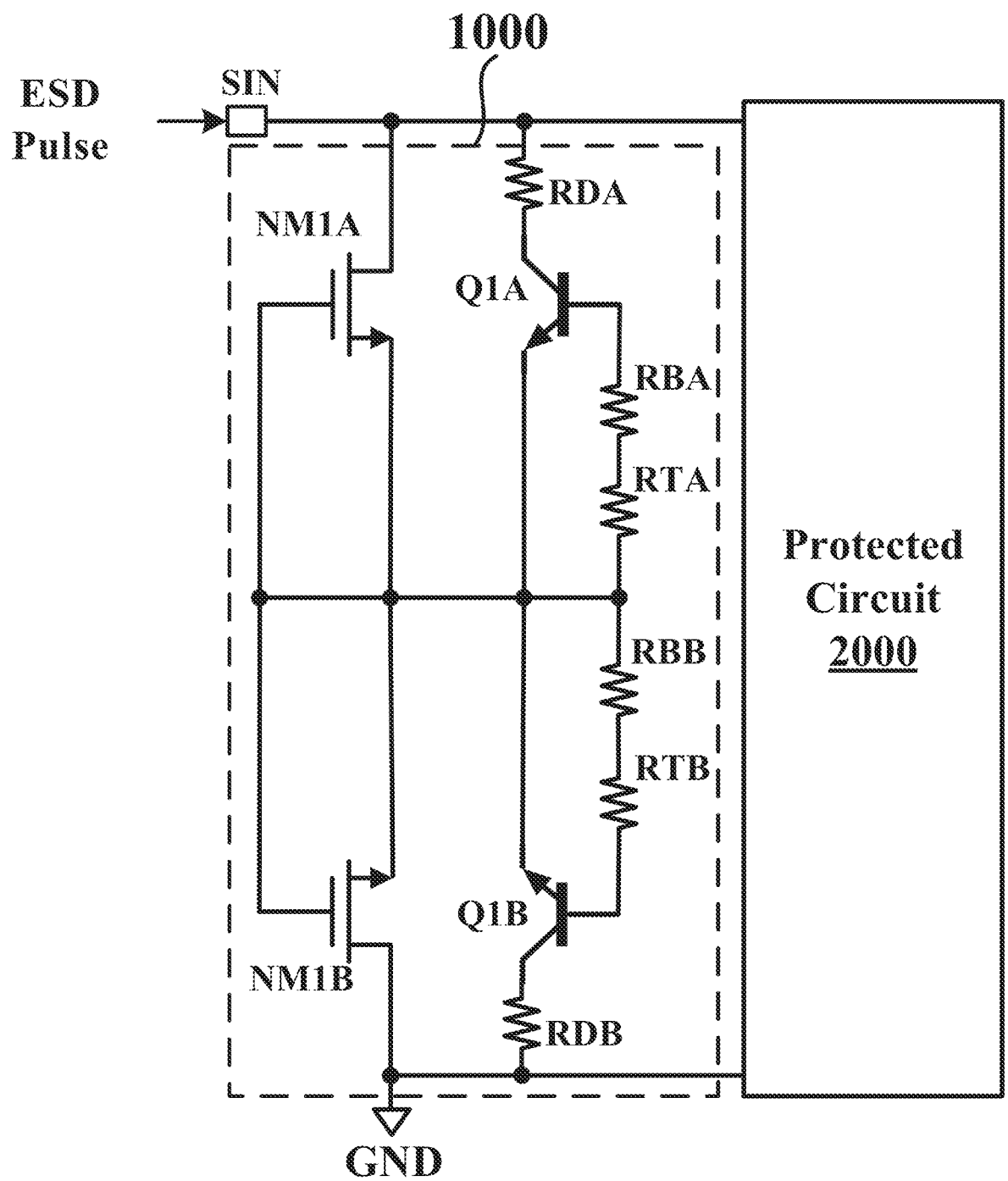
FIG. 16 is a schematic diagram of a circuit structure of an electrostatic discharge protection circuit according to yet another embodiment of the present application.
Figure 17:
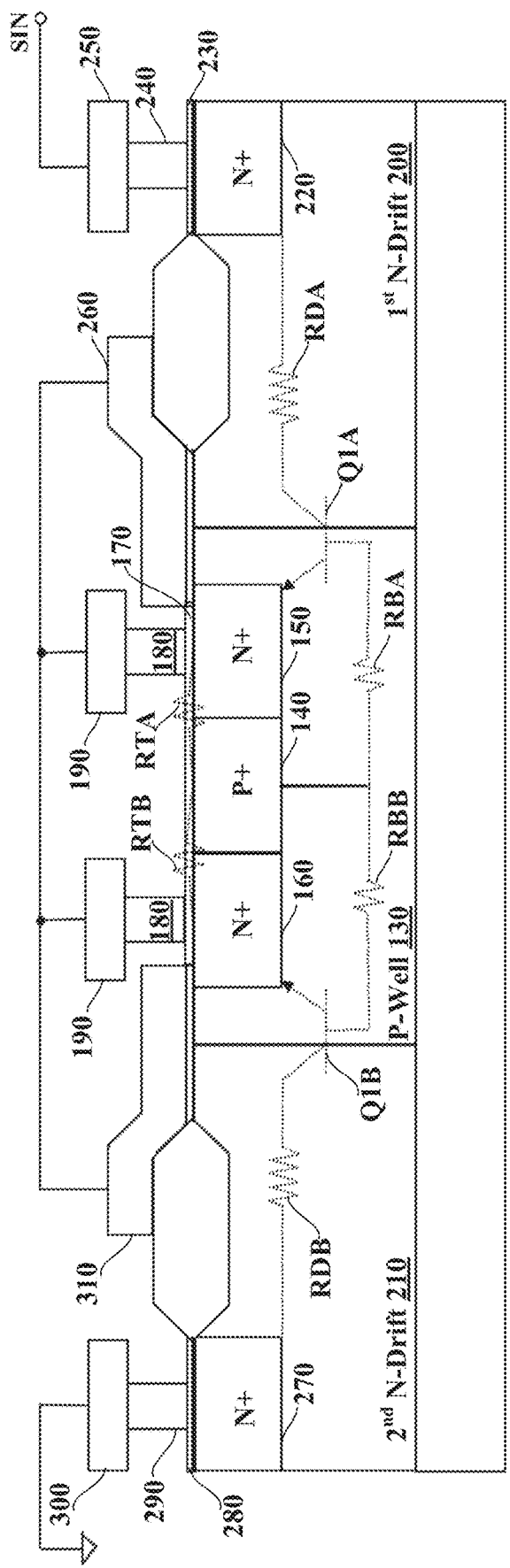
FIG. 17 is a cross-sectional view of another back-to-back transistor according to another embodiment of the present application.

In some embodiments, as shown in FIG. 16 and FIG. 17, the back to back transistors may also be implemented in a manner similar to that described with respect to FIG. 12. As an example, the first metal 190 may only be electrically connected to portions of the first metal silicide layer 170 on the surfaces of both the first source sub-region 150 and the second source sub-region 160 through the plurality of first contact structures 180 to increase the resistance between the base of the first parasitic bipolar transistor Q1A and the first source sub-region 150 and the resistance between the base of the second parasitic bipolar transistor Q1B and the second source sub-region 160. Thus, this enables to achieve more reliable ESD protection while allowing the signal input terminal SIN to handle positive and negative voltages.

Referring to FIG. 18, FIG. 18 is a flowchart of a method for forming a transistor provided by the embodiments of the present application. As shown in FIG. 18, the method for making the transistor includes the following steps:

Step 1801: Arranging, in a P-type well of the transistor, a source region and a body terminal region adjacent to the source region.

Step 1802: Arranging a first metal silicide layer on surfaces of the body terminal region and the source region, where the first metal silicide layer is electrically connected to the body terminal region and the source region separately.

Step 1803: Arranging a plurality of first contact structures only on a portion of the first metal silicide layer that is on the surface of the body terminal region, each of the first contact structures being electrically connected to the body terminal region through the first metal silicide layer to increase the resistance between the emitter of a parasitic bipolar transistor and the body terminal region, or, arranging a plurality of first contact structures only on a portion of the first metal silicide layer that is on the surface of the source region, each of the first contact structures being electrically connected to the source region through the first metal silicide layer to increase the resistance between the base of the parasitic bipolar transistor and the source region, where each of the first contact structures is electrically connected to a first metal.

Referring to FIG. 19, FIG. 19 is a flowchart of another method for making/forming a transistor provided by the embodiments of the present application. As shown in FIG. 19, the method for making the transistor includes the following steps:

Step 1901: Arranging, in a P-type well of the transistor, a source region and a body terminal region adjacent to the source region, where the source region includes a first source sub-region and a second source sub-region, and the body terminal region is arranged between the first source sub-region and the second source sub-region.

Step 1902: Arranging a first metal silicide layer on surfaces of the body terminal region, the first source sub-region and the second source sub-region, where the first metal silicide layer is electrically connected to the body terminal region, the first source sub-region and the second source sub-region, separately.

Step 1903: Arranging a plurality of first contact structures only on a portion of the first metal silicide layer that is on the surface of the body terminal region, each of the first contact structures being electrically connected to the body terminal region through the first metal silicide layer to increase the resistance between the emitter of a first parasitic bipolar transistor and the body terminal region and the resistance between the emitter of a second parasitic bipolar transistor and the body terminal region, or arranging a plurality of first contact structures only on portions of the first metal silicide layer that is on the surfaces of the first source sub-region and the second source sub-region, each of the first contact structures being electrically connected to the first source sub-region and the second source sub-region through the first metal silicide layer to increase the resistance between the base of the first parasitic bipolar transistor and the first source sub-region and the resistance between the base of the second parasitic bipolar transistor and the second source sub-region, where each of the first contact structures is electrically connected to the first metal.

In one embodiment, a specific implementation process of Step 1801 or Step 1901 in arranging the source region and the adjacent body terminal region in the P-type well of the transistor may include: arranging a continuous source region and a continuous body terminal region in parallel with the continuous source region in the P-type well.

In one embodiment, a specific implementation process of Step 1801 or Step 1901 in arranging the source region and the adjacent body terminal region in the P-type well of the transistor includes: arranging a source region in the P-type well and embedding a discontinuous body terminal region within the source region, where the discontinuous body terminal region is surrounded by the source region.

In one embodiment, the method further includes: adjusting the shape of the first metal silicide layer to control the resistance between the source region and the body terminal region, as shown in FIG. 18 or FIG. 19.

It should be understood that the specific configuration of the transistor and the resulting beneficial effects in the embodiment methods can refer to the corresponding descriptions in the embodiments of the transistor, and for simplicity, they are not repeated herein.

The embodiments of the present application also provide an electronic device, which includes a signal input terminal, a protected circuit, and an ESD protection circuit as described in any of the embodiments of the present application. The ESD protection circuit is electrically connected to the signal input terminal and the protected circuit.

The above descriptions are merely exemplary and do not limit the scope of the present application. Any equivalent structures or process changes made using the contents of specification and drawings of the present application, or direct or indirect application in other related technical fields, shall fall within the scope of the present application.

The above embodiments are only used to illustrate the technical solutions of the present application, and not to limit them. Based on the concept of the present application, the technical features in the above embodiments or different embodiments can be combined, and steps can be implemented in any order. Those ordinarily skilled in the art should understand that modifications can be made to the technical solutions described in the above embodiments, or some technical features can be equivalently replaced. These modifications or replacements do not deviate from the substance of the corresponding technical solutions of the present application.

What is claimed is:

1. A transistor comprising:
    a P-type well, a body terminal region, and a source region, wherein the body terminal region and the source region are arranged in the P-type well, and the body terminal region is adjacent to the source region;
    a first metal silicide layer arranged on surfaces of the body terminal region and the source region, and electrically connected to the body terminal region and the source region separately; and
    a first metal and a plurality of first contact structures, wherein:
        the first metal is electrically connected, through the plurality of first contact structures, only to a first portion of the first metal silicide layer that is located on a surface of the body terminal region to generate a resistance between an emitter of a parasitic bipolar transistor of the transistor and the body terminal region, or
        the first metal is electrically connected, through the plurality of first contact structures, only to a second portion of the first metal silicide layer located on a surface of the source region to generate a resistance between a base of the parasitic bipolar transistor of the transistor and the source region; and
    wherein a PN junction between the base and the emitter of the parasitic bipolar transistor is located between the P-type well and the source region; and
    wherein the body terminal region and the source region extend continuously alongside each other.

2. The transistor according to claim 1, wherein a shape of the first metal silicide layer is patterned in order to regulate a resistance between the source region and the body terminal region.

3. An electrostatic discharge protection circuit including a transistor, the transistor comprising:
    a P-type well, a body terminal region, and a source region, wherein the body terminal region and the source region are arranged in the P-type well, and the body terminal region is adjacent to the source region;
    a first metal silicide layer arranged on surfaces of the body terminal region and the source region, and electrically connected to the body terminal region and the source region separately; and
    a first metal and a plurality of first contact structures, wherein:
        the first metal is electrically connected, through the plurality of first contact structures, only to a first portion of the first metal silicide layer that is located on a surface of the body terminal region to generate a resistance between an emitter of a parasitic bipolar transistor of the transistor and the body terminal region, or
        the first metal is electrically connected, through the plurality of first contact structures, only to a second portion of the first metal silicide layer located on a surface of the source region to generate a resistance between a base of the parasitic bipolar transistor of the transistor and the source region; and
    wherein a PN junction between the base and the emitter of the parasitic bipolar transistor is located between the P-type well and the source region; and
    wherein the first metal of the transistor is connected to the gate of the transistor and electrically connected to a ground, and a drain of the transistor is electrically connected to a signal input terminal.

4. The electrostatic discharge protection circuit according to claim 3, wherein the body terminal region and the source region extends continuously alongside each other.

5. The electrostatic discharge protection circuit according to claim 3, wherein the body terminal region is a discontinuous region arranged in the source region and surrounded by the source region.

6. The electrostatic discharge protection circuit according to claim 3, wherein the transistor further comprises an N-type drift region, a drain region arranged in the N-type drift region, a second metal silicide layer, a second metal and a plurality of second contact structures, and wherein the drain region is electrically connected to the second metal through the second metal silicide layer and the plurality of second contact structures, and the second metal is electrically connected to the signal input terminal.

7. The electrostatic discharge projection circuit according to claim 3, wherein a shape of the first metal silicide layer is patterned in order to regulate a resistance between the source region and the body terminal region.

8. A method comprising:
    arranging, in a P-type well of a transistor, a source region and a body terminal region adjacent to the source region, the arranging comprising arranging the source region and the body terminal region to extend continuously alongside each other in the P-type well of the transistor;
    arranging a first metal silicide layer on surfaces of the body terminal region and the source region, wherein the first metal silicide layer is electrically connected to the body terminal region and the source region separately; and
    arranging a plurality of first contact structures only on a first portion of the first metal silicide layer that is arranged on a surface of the body terminal region, with each first contact structure electrically connected to the body terminal region through the first metal silicide layer to generate a resistance between an emitter of a parasitic bipolar transistor of the transistor and the body terminal region; or arranging a plurality of first contact structures only on a second portion of the first metal silicide layer that is arranged on a surface of the source region, with each first contact structure electrically connected to the source region through the first metal silicide layer to generate a resistance between a base of the parasitic bipolar transistor and the source region, wherein each first contact structure is electrically connected to the first metal silicide layer; and wherein a PN junction between the base and the emitter of the parasitic bipolar transistor is located between the P-type well and the source region.

9. The method according to claim 8, further comprising:
patterning a shape of the first metal silicide layer to regulate a resistance between the source region and the body terminal region.

10. An electronic device comprising: a signal input terminal, a circuit, and an electrostatic discharge protection circuit electrically connected to the signal input terminal and the circuit, wherein the electrostatic discharge protection circuit is configured to protect the circuit and includes a transistor comprising:
  a P-type well, a body terminal region, and a source region, wherein the body terminal region and the source region are arranged in the P-type well, and the body terminal region is adjacent to the source region;
  a first metal silicide layer arranged on surfaces of the body terminal region and the source region, and electrically connected to the body terminal region and the source region separately; and
  a first metal and a plurality of first contact structures, wherein:
    the first metal is electrically connected, through the plurality of first contact structures, only to a first portion of the first metal silicide layer that is located on a surface of the body terminal region to generate a resistance between an emitter of a parasitic bipolar transistor of the transistor and the body terminal region, or
    the first metal is electrically connected, through the plurality of first contact structures, only to a second portion of the first metal silicide layer located on a surface of the source region to generate a resistance between a base of the parasitic bipolar transistor of the transistor and the source region; and
  wherein a PN junction between the base and the emitter of the parasitic bipolar transistor is located between the P-type well and the source region; and
  wherein the first metal of the transistor is connected to a gate of the transistor and electrically connected to a ground, and a drain of the transistor is electrically connected to a signal input terminal.

11. The electronic device according to claim 10, wherein the body terminal region and the source region extends continuously alongside each other.

12. The electronic device according to claim 10, wherein the body terminal region is a discontinuous region arranged in the source region and surrounded by the source region.

13. The electronic device according to claim 10, wherein the transistor further comprises an N-type drift region, a drain region arranged in the N-type drift region, a second metal silicide layer, a second metal and a plurality of second contact structures, and wherein the drain region is electrically connected to the second metal through the second metal silicide layer and the plurality of second contact structures, and the second metal is electrically connected to the signal input terminal.

14. The electrostatic device according to claim 10, wherein a shape of the first metal silicide layer is patterned in order to regulate a resistance between the source region and the body terminal region.

15. A transistor comprising:
  a P-type well, a body terminal region, and a source region, wherein the body terminal region and the source region are arranged in the P-type well, and the body terminal region is adjacent to the source region;
  a first metal silicide layer arranged on surfaces of the body terminal region and the source region, and electrically connected to the body terminal region and the source region separately; and
  a first metal and a plurality of first contact structures, wherein:
    the first metal is electrically connected, through the plurality of first contact structures, only to a first portion of the first metal silicide layer that is located on a surface of the body terminal region to generate a resistance between an emitter of a parasitic bipolar transistor of the transistor and the body terminal region, or
    the first metal is electrically connected, through the plurality of first contact structures, only to a second portion of the first metal silicide layer located on a surface of the source region to generate a resistance between a base of the parasitic bipolar transistor of the transistor and the source region; and
  wherein a PN junction between the base and the emitter of the parasitic bipolar transistor is located between the P-type well and the source region; and
  wherein the body terminal region is a discontinuous region arranged in the source region and surrounded by the source region.

16. The transistor according to claim 15, wherein a shape of the first metal silicide layer is patterned in order to regulate a resistance between the source region and the body terminal region.

17. A transistor comprising:
  a P-type well, a body terminal region, and a source region, wherein the body terminal region and the source region are arranged in the P-type well, and the body terminal region is adjacent to the source region;
  a first metal silicide layer arranged on surfaces of the body terminal region and the source region, and electrically connected to the body terminal region and the source region separately; and
  a first metal and a plurality of first contact structures, wherein:
    the first metal is electrically connected, through the plurality of first contact structures, only to a first portion of the first metal silicide layer that is located on a surface of the body terminal region to generate a resistance between an emitter of a parasitic bipolar transistor of the transistor and the body terminal region, or
    the first metal is electrically connected, through the plurality of first contact structures, only to a second portion of the first metal silicide layer located on a surface of the source region to generate a resistance between a base of the parasitic bipolar transistor of the transistor and the source region; and
  wherein a PN junction between the base and the emitter of the parasitic bipolar transistor is located between the P-type well and the source region; and
  wherein the transistor further comprises: an N-type drift region, a drain region arranged in the N-type drift region, a second metal silicide layer, a second metal and a plurality of second contact structures, wherein the drain region is electrically connected to the second metal through the second metal silicide layer and the plurality of second contact structures, and the second metal is electrically connected to a signal input terminal.

18. A method comprising:
arranging, in a P-type well of a transistor, a source region and a body terminal region adjacent to the source region, the arranging comprising:
arranging the source region in the P-type well of the transistor; and
configuring the body terminal region as a discontinuous region, and arranging the body terminal region in the source region with the body terminal region surrounded by the source region;
arranging a first metal silicide layer on surfaces of the body terminal region and the source region, wherein the first metal silicide layer is electrically connected to the body terminal region and the source region separately; and
arranging a plurality of first contact structures only on a first portion of the first metal silicide layer that is arranged on a surface of the body terminal region, with each first contact structure electrically connected to the body terminal region through the first metal silicide layer to generate a resistance between an emitter of a parasitic bipolar transistor of the transistor and the body terminal region; or arranging a plurality of first contact structures only on a second portion of the first metal silicide layer that is arranged on a surface of the source region, with each first contact structure electrically connected to the source region through the first metal silicide layer to generate a resistance between a base of the parasitic bipolar transistor and the source region, wherein each first contact structure is electrically connected to the first metal silicide layer; and
wherein a PN junction between the base and the emitter of the parasitic bipolar transistor is located between the P-type well and the source region.

19. The method according to claim 18, further comprising:
patterning a shape of the first metal silicide layer to regulate a resistance between the source region and the body terminal region.

20. A method comprising:
arranging, in a P-type well of a transistor, a source region and a body terminal region adjacent to the source region;
arranging a first metal silicide layer on surfaces of the body terminal region and the source region, wherein the first metal silicide layer is electrically connected to the body terminal region and the source region separately; and
arranging a plurality of first contact structures only on a first portion of the first metal silicide layer that is arranged on a surface of the body terminal region, with each first contact structure electrically connected to the body terminal region through the first metal silicide layer to generate a resistance between an emitter of a parasitic bipolar transistor of the transistor and the body terminal region; or arranging a plurality of first contact structures only on a second portion of the first metal silicide layer that is arranged on a surface of the source region, with each first contact structure electrically connected to the source region through the first metal silicide layer to generate a resistance between a base of the parasitic bipolar transistor and the source region, wherein each first contact structure is electrically connected to the first metal silicide layer; and
wherein a PN junction between the base and the emitter of the parasitic bipolar transistor is located between the P-type well and the source region; and
wherein the transistor further comprises an N-type drift region, a drain region arranged in the N-type drift region, a second metal silicide layer, a second metal and a plurality of second contact structures, and wherein the drain region is electrically connected to the second metal through the second metal silicide layer and the plurality of second contact structures, and the second metal is electrically connected to the signal input terminal.

\* \* \* \* \*